United States Patent
Hamer et al.

(10) Patent No.: US 12,249,278 B2
(45) Date of Patent: Mar. 11, 2025

(54) STACKED OLED MICRODISPLAY WITH LOW-VOLTAGE SILICON BACKPLANE

(71) Applicants: OLEDWorks LLC, Rochester, NY (US); Fraunhofer-Gesellschaft zur Förderung der angewandten Forschung e.V., Munich (DE)

(72) Inventors: John Hamer, Rochester, NY (US); Marina Kondakova, Kendall, NY (US); Jeffrey Spindler, Ontario, NY (US); Bernd Richter, Dresden (DE); Philipp Wartenberg, Dresden (DE); Gerd Bunk, Dresden (DE); Uwe Vogel, Dresden (DE)

(73) Assignees: OLEDWorks LLC, Rochester, NY (US); Fraunhofer-Gesellschaft e.V., Munich (DE)

( * ) Notice: Subject to any disclaimer, the term of this patent is extended or adjusted under 35 U.S.C. 154(b) by 474 days.

(21) Appl. No.: 17/601,202

(22) PCT Filed: Jan. 26, 2021

(86) PCT No.: PCT/US2021/015031
§ 371 (c)(1),
(2) Date: Oct. 4, 2021

(87) PCT Pub. No.: WO2021/154690
PCT Pub. Date: Aug. 5, 2021

(65) Prior Publication Data
US 2022/0199931 A1 Jun. 23, 2022

Related U.S. Application Data

(60) Provisional application No. 63/054,387, filed on Jul. 21, 2020, provisional application No. 62/966,757, filed on Jan. 28, 2020.

(51) Int. Cl.
*G09G 3/3233* (2016.01)
*H10K 50/13* (2023.01)
(Continued)

(52) U.S. Cl.
CPC .......... G09G 3/3233 (2013.01); H10K 50/13 (2023.02); H10K 50/19 (2023.02); H10K 50/852 (2023.02);
(Continued)

(58) Field of Classification Search
CPC .... H10K 50/13; H10K 50/828; H10K 50/852; H10K 59/12; H10K 59/1213;
(Continued)

(56) References Cited

U.S. PATENT DOCUMENTS 5,760,477 A    6/1998   Cronin
5,764,077 A *  6/1998   Andresen ......... H03K 19/00315
                                                   326/58

(Continued)

FOREIGN PATENT DOCUMENTS

CN    100483728 C    4/2009
CN    101621198 A    1/2010
(Continued)

OTHER PUBLICATIONS

Taiwan Office Action of Sep. 8, 2023.
(Continued)

*Primary Examiner* — Ratisha Mehta
*Assistant Examiner* — Brad A Knudson

(57) ABSTRACT

A microdisplay comprising a light emitting OLED stack on top of a silicon-based backplane with individually addressable pixels and control circuitry wherein the light emitting OLED stack has three or more OLED units between a top electrode and a bottom electrode; and the control circuitry of the silicon-based backplane comprises at least two transis- (Continued)

tors with their channels connected in series between an external power source VDD, and the bottom electrode of the OLED stack. The light-emitting OLED stack preferably has a Vth of at least 7.5V or more. The control circuit can include a protection circuit comprised of a p-n diode, preferably a bipolar junction transistor.

19 Claims, 17 Drawing Sheets

(51) Int. Cl.
| | |
|---|---|
| H10K 50/19 | (2023.01) |
| H10K 50/852 | (2023.01) |
| H10K 59/12 | (2023.01) |
| H10K 59/121 | (2023.01) |
| H10K 59/123 | (2023.01) |
| H10K 59/131 | (2023.01) |
| H10K 59/32 | (2023.01) |
| H10K 59/80 | (2023.01) |
| H10K 102/00 | (2023.01) |

(52) U.S. Cl.
CPC ......... *H10K 59/12* (2023.02); *H10K 59/1213* (2023.02); *H10K 59/123* (2023.02); *H10K 59/131* (2023.02); *H10K 59/32* (2023.02); *H10K 59/876* (2023.02); *G09G 2300/0426* (2013.01); *G09G 2300/0842* (2013.01); *G09G 2300/0861* (2013.01); *G09G 2330/04* (2013.01); *H10K 2102/3026* (2023.02)

(58) Field of Classification Search
CPC .... H10K 59/123; H10K 59/131; H10K 59/32; H10K 59/876; H10K 50/19; G09G 3/3233
See application file for complete search history.

(56) References Cited

U.S. PATENT DOCUMENTS

| | | | |
|---|---|---|---|
| 6,392,617 B1 | 5/2002 | Gleason | |
| 6,580,657 B2 | 6/2003 | Sanford et al. | |
| 6,872,472 B2 | 3/2005 | Liao et al. | |
| 7,273,663 B2 | 9/2007 | Liao et al. | |
| 7,315,292 B2 | 1/2008 | Yamashita | |
| 7,384,810 B2 | 6/2008 | Tai et al. | |
| 8,692,821 B2 | 4/2014 | Park | |
| 9,059,123 B2 | 6/2015 | Hekmatshoartabari et al. | |
| 9,066,379 B2 | 6/2015 | Kreye et al. | |
| 9,281,487 B2 | 3/2016 | Kim et al. | |
| 9,293,912 B2 | 3/2016 | Parthasarathy et al. | |
| 9,299,817 B2 | 3/2016 | Yoo et al. | |
| 9,379,346 B2 | 6/2016 | Forrest et al. | |
| 9,489,886 B2 | 11/2016 | Sarma et al. | |
| 9,741,957 B2 | 8/2017 | Jung et al. | |
| 10,223,972 B1 | 3/2019 | Kuang et al. | |
| 10,510,973 B2 | 12/2019 | Yamamoto et al. | |
| 10,685,600 B2 | 6/2020 | Matsueda | |
| 10,827,582 B2 | 11/2020 | Mao et al. | |
| 10,978,002 B2 | 4/2021 | Yue et al. | |
| 11,011,586 B2 | 5/2021 | Fan et al. | |
| 11,289,669 B2 | 3/2022 | Yang et al. | |
| 2001/0005159 A1 | 6/2001 | Matsumoto | |
| 2001/0045929 A1 | 11/2001 | Prache et al. | |
| 2002/0084463 A1 | 7/2002 | Sanford et al. | |
| 2003/0170491 A1* | 9/2003 | Liao | H05B 45/60 257/88 |
| 2005/0029933 A1 | 2/2005 | Liao et al. | |
| 2005/0230757 A1 | 10/2005 | Nagasawa et al. | |
| 2006/0044229 A1 | 3/2006 | Yamazaki et al. | |
| 2006/0221251 A1 | 10/2006 | Omata et al. | |
| 2006/0240277 A1 | 10/2006 | Hatwar et al. | |
| 2007/0001588 A1 | 1/2007 | Boroson et al. | |
| 2007/0046189 A1 | 3/2007 | Hatwar et al. | |
| 2007/0126665 A1 | 6/2007 | Kimura | |
| 2007/0241664 A1 | 10/2007 | Sakamoto et al. | |
| 2008/0169822 A1 | 7/2008 | Kwak | |
| 2008/0316659 A1 | 12/2008 | Oguzman et al. | |
| 2009/0201231 A1 | 8/2009 | Takahara et al. | |
| 2009/0302741 A1 | 12/2009 | Fery | |
| 2011/0037054 A1 | 2/2011 | Shieh et al. | |
| 2011/0199356 A1 | 8/2011 | Ochi et al. | |
| 2011/0291572 A1 | 12/2011 | Burroughes et al. | |
| 2012/0062536 A1* | 3/2012 | Park | G09G 3/3233 345/82 |
| 2012/0230120 A1 | 9/2012 | Torii | |
| 2013/0154498 A1 | 6/2013 | Missbach | |
| 2013/0277656 A1 | 10/2013 | Seo et al. | |
| 2014/0320550 A1* | 10/2014 | Liao | G09G 3/3225 345/82 |
| 2014/0332790 A1 | 11/2014 | Fadhel et al. | |
| 2015/0085407 A1 | 3/2015 | Chen et al. | |
| 2015/0270255 A1 | 9/2015 | Ikeda et al. | |
| 2016/0093605 A1 | 3/2016 | Sai | |
| 2017/0025630 A1 | 1/2017 | Seo et al. | |
| 2017/0213502 A1 | 7/2017 | Henry et al. | |
| 2017/0317107 A1 | 11/2017 | Kumar et al. | |
| 2018/0301090 A1 | 10/2018 | Kuang | |
| 2018/0331292 A1 | 11/2018 | Kalisz et al. | |
| 2019/0074470 A1 | 3/2019 | Takagi | |
| 2019/0304386 A1 | 10/2019 | Kim et al. | |
| 2020/0013978 A1 | 1/2020 | Tanaka | |
| 2020/0202973 A1 | 6/2020 | Shi et al. | |
| 2021/0091152 A1 | 3/2021 | Yang et al. | |

FOREIGN PATENT DOCUMENTS

| | | | |
|---|---|---|---|
| CN | 108335672 A | 7/2018 | |
| CN | 109148725 A | 1/2019 | |
| CN | 107068059 B | 10/2019 | |
| CN | 110610975 A | 12/2019 | |
| CN | 111312908 A | 6/2020 | |
| JP | 2004-302289 A | 10/2004 | |
| JP | 2010-181823 A | 8/2010 | |
| JP | 2014-145851 A | 8/2014 | |
| JP | 2016-58423 A | 4/2016 | |
| JP | 2016200828 A * | 12/2016 | ........... G09G 3/3225 |
| JP | 2018-68117 A | 4/2018 | |
| JP | 2018-088417 A | 6/2018 | |
| JP | 2018-174246 A | 11/2018 | |
| JP | 2019-200435 A | 11/2019 | |
| KR | 10-2008-0064131 A | 7/2008 | |
| KR | 10-2013-0051542 | 5/2013 | |
| TW | I695363 B | 6/2020 | |
| WO | 2002/071379 A2 | 9/2002 | |
| WO | 2008057372 A2 | 5/2008 | |
| WO | 2014/021159 A1 | 2/2014 | |

OTHER PUBLICATIONS

Attorney Translation of Office Action. Previously uncited references highlighted on p. 3, 6.
Machine translation of CN 107068059B.
Translation of Taiwan office action, edited to show US equivalent (p. 5, edit in red).
Google translation of CN 111312908.
Google translation of TW 1695363.
Ali et al, "Recent advances in small molecule OLED-on-Silicon microdisplays", Proc. of SPIE vol. 7415 74150Q-1, 2009.
Jang et al, J. Information Display, 20(1), 1-8 (2019).
Fujii et al, "4032ppi High-Resolution OLED Microdisplay", SID 2018 Digest, p. 613; US2019/0259337.
Vogel et al, SID 2017 DIGEST, Article 77-1, pp. 1125-1128.
Vogel et al, 2018 48th European Solid-State Device Research Conference, p. 90, Sep. 2018.
Wartenberg et al, "High Frame-Rate 1" WUXGA OLED Microdisplay and Advanced Free-Form Optics for Ultra-Compact VR Headsets", SID Proceedings, 49 (1), Paper 40-5, 514 (2018).

(56) References Cited

OTHER PUBLICATIONS

Springer et al, Optics Express, 24 (24), 28131 (2016).
Spindler et al, "High Brightness OLED Lighting", SID Display Week 2016, San Francisco CA, May 23-27, 2016).
O. Prache, Journal of the Society for Information Display, 10(2), 133 (2002).
O. Prache, Active Matrix Molecular OLED Microdisplays, Displays, 22, 49-56 (2001).
Howard et al, "Microdisplays based upon organic light emitting diodes", IBM J. of Res. & Dev., 45 (1), 15 (2001).
Cho et al, Journal of Information Display, 20(4), 249-255, 2019.
Xiao, "Recent Developments in Tandem White Organic Light-Emitting Diodes", Molecules, 24, 151 (2019).
Han et al, "Advanced Technologies for Large-Sized OLED Displays", Chapter 3, 10.5772/intechopen.74869 (2018).
Liu et al., J. Cent. South Univ., 19, 1276-1282 (2012).
Zeng et al, "A Novel Pixel Circuit with Threshold Voltage Variation Compensation in Three-Dimensional AMOLED on Silicon Microdisplays", P-27, SID 2019 Digest, p. 1313.
Pashmineh et al, "High-voltage circuits for power management on 65nm CMOS", Adv. Radio Sci., 13, 109-120, 2015.
Dawson et al, "The Impact of the Transient Response of Organic Light Emitting Diodes on the Design of Active Matrix OLED Displays", International Electronic Devices Mtg 1998, 875-878.
Kwak et al, "Organic Light-Emitting Diode-on-Silicon Pixel Circuit Using the Source Follower Structure with Active Load for Microdisplays", Japanese Journal of Applied Physics, 50, 03CC05 (2011).
Website: https://www.blurbusters.com/faq/oled-motion-blur/; "Why Do Some OLEDs Have Motion Blur?", dated Dec. 28, 2018.
Website: https://www.soundandvision.com/content/motion-resolution-issue-oled-tvs; "Is Motion Resolution an Issue with OLED TVs", dated Jan. 15, 2015.
Website: https://www.kopin.com/kopin-to-showcase-latest-advances-in-its-lightning-oled-microdisplay-line-up-at-ces-2020/; dated Jan. 7, 2020.
Website: https://hdguru.com/calibration-expert-is-10000-nits-of-brightness-enough/; dated Jul. 26, 2018.
Website: https://www.businesswire.com/news/home/20200630005205/en/Kopin-Announces-Breakthrough-ColorMax%E2%84%A2-Technology-Unparalleled-Color.
Website: https://www.ravepubs.com/oled-silicon-come-new-joint-venture/; published 2018.
Japan Patent Office Action of Jan. 9, 2024 with cited references.
Machine translation of office action. References (p. 6-7) cited in a previous IDS are crossed out.
JPO translation of JP 2016-58423A.
JPO translation of JP 2018-174246A.
JPO translation of JP 2014-145851A.
JPO translation of JP 2018-68117A.
JPO translation of JP 2010-181823A.
Japan Patent Office, Office Action of May 21, 2024.
Machine translation of JPO Office Action of May 21, 2024—p. 3-5, references in previous IDS forms crossed out.
JP 2004-302289 machine translation.
JP 2019-200435 machine translation.
Korean Patent Office, Office Action of May 31, 2024.
Machine translation of Korean Office Action of May 31, 2024—p. 3, references in previous IDS forms crossed out.
Allowance Notice, Sep. 3, 2024, Japan Patent Office, Pat. Appl. 2024-124276 (Divisional application of JP equivalent of U.S. Appl. No. 17/601,202).
Machine translation, Allowance Notice, Sep. 3, 2024, Japan Patent Office, Pat. Appl. 2024-124276. Previously cited references crossed out, equivalents indicated where appropriate.
Office Action, Aug. 6, 2024, Japan Patent Office, Pat. Appl. 2021-549824 (JP Equivalent of U.S. Appl. No. 17/601,531).
Machine translation, Office Action, Aug. 6, 2024, Japan Patent Office, Pat. Appl. 2021-549824. Previously cited references crossed out, equivalents indicated where appropriate.
WO 2014-021159 Machine translation (by WIPO).
CN 108335672 Machine translation (by Google).
JP 2018-088417 Machine translation (by JP Patent Office).
CN 101621198 Machine translation (by Google).
KR 10-2013-0051542 Machine translation (by KR Patent Office).
Allowance Notice, Jul. 2, 2024, Japan Patent Office, Pat. Appl. 2021-549818 (JP equivalent of U.S. Appl. No. 17/601,202).
Machine translation, Allowance Notice, Jul. 2, 2024, Japan Patent Office, Pat. Appl. 2021-549818.
Allowance Notice, Jul. 2, 2024, Taiwan Patent Office, Pat. Appl. 110124008 2 (TW equivalent of U.S. Appl. No. 17/601,202).
Machine translation, Allowance Notice, Jul. 2, 2024, Taiwan Patent Office, Pat. Appl. 110124008 2.
Office Action, Sep. 24, 2024, Japan Patent Office, Pat. Appl. 2021-549824 (JP Equivalent of U.S. Appl. No. 17/601,531).
Machine translation, Office Action, Sep. 24, 2024, Japan Patent Office, Pat. Appl. 2021-549824. Previously cited references crossed out, equivalents indicated where appropriate.
Office Action, Oct. 8, 2024, Japan Patent Office, Pat. Appl. 2024-124275 (Divisional application of JP equivalent of U.S. Appl. No. 17/601,202).
Machine translation, Office Action, Oct. 8, 2024, Japan Patent Office, Pat. Appl. 2024-124275. Previously cited references crossed out, equivalents indicated where appropriate.
CNIPA Office Action dated Jun. 26, 2024 for CN Application No. 202180002406.1 (CN counterpart of U.S. Appl. No. 17/601,202).
Machine (Google) translation of Office action. pp. 11-12: US equivalents added, and previously reported references crossed out.
CNIPA Office Action dated Jun. 27, 2024 for CN Application No. 202180002415.0 (CN counterpart of U.S. Appl. No. 17/601,531).
Machine (Google) translation of Office action. pp. 10-11: US equivalents added, and previously reported references crossed out.
Japan Patent Office, Dec. 24, 2024, Notice of Allowance of JP Patent Application 2024-124275 (Divisional of JP Patent Application 2021-549818 = JP equivalent of U.S. Appl. No. 17/601,202). Original document p. 1-2, translation p. 3-4. No new references cited.

* cited by examiner

STACKED OLED MICRODISPLAY WITH LOW-VOLTAGE SILICON BACKPLANE

CROSS-REFERENCE TO RELATED APPLICATION

This application is the U.S. National Phase application under 35 U.S.C. § 371 of International Application No. PCT/US2021/015031, entitled "STACKED OLED MICRODISPLAY WITH LOW-VOLTAGE SILICON BACKPLANE" and filed on Jan. 26, 2021, which claims the benefit of U.S. provisional U.S. Application 62/966,757, entitled "STACKED OLED MICRODISPLAY WITH LOW-VOLTAGE SILICON BACKPLANE" and filed Jan. 28, 2020, as well as U.S. provisional U.S. Application 63/054,387, also entitled "STACKED OLED MICRODISPLAY WITH LOW-VOLTAGE SILICON BACKPLANE" and filed Jul. 21, 2020.

BACKGROUND

Typically, a microdisplay is less than two inches diagonal (approx. 5 cm) down to an ultra-small display size of less than 0.25" diagonal. In most cases, the resolution of the microdisplay is high and the pixel pitch is usually 5 to 15 microns. First introduced commercially in the late 1990s, they are commonly used for rear-projection TVs, head-mounted displays, and digital camera view finders. In recent years, devices like smart watches have taken advantage of the high resolution and low power consumption of these displays. Microdisplays are expected to proliferate with the global market projected at 20% compound annual growth rate in the next few years. One of the trends driving this growth will be the increasing adoption of near-eye displays, augmented reality devices and virtual reality devices such as head-mounted displays (HMDs), head-up displays (HUDs), and electronic view finders (EVFs).

There are two main categories of microdisplays. The first is a projection microdisplay, which involves a highly magnified image projected onto a surface. Types of projection microdisplays include rear-projection TVs and compact data projectors. The second is a near-to-eye display (NED), which consists of a highly magnified virtual image viewed through an eyepiece (such as a virtual reality headset or camcorder viewfinder). These displays are increasingly being used in HMDs and HUDs, especially in the military and medical industries.

Both types of microdisplays offer significant advantages over conventional direct-view displays such as flat-panel LCDs. Microdisplay advantages include the ability to produce a large image from a very small, lightweight source display unit, making them easy to integrate into space-constrained technology, such as wearables; large pixel capacity, producing high resolution and clarity; and greater power-efficiency as compared to other display types. The higher the resolution and brightness, and the lower the power consumption, the better quality the microdisplay. The challenge for microdisplay makers, however, has been relatively high production costs, together with the need for high brightness and contrast and long operational lifetime.

Microdisplays can be made from a range of display technologies, including Liquid Crystal-On-Silicon (LCoS); Liquid Crystal Displays (LCD); Digital Micromirror Devices (DMD); Digital Light Processing (DLP); and more recently, MicroLED (Light Emitting Diode) and Organic Light Emitting Diode (OLED).

LCD has dominated the microdisplay market in recent years. LCD technology offers high brightness, relatively low cost, and a relatively simple manufacturing process. Using LCDs, device manufacturers have been able to reduce the size of microdisplay components over time. LCD displays are currently being used in some HMDs, HUDs, EVFs, and thermal-imaging glasses and wearables. However, LCD microdisplays require a light source, or a backlight, in order to create an image together with a liquid crystal array in order to modulate the light. This technology has limitations, such as polarization, color space, maximum luminance limitation, LC temperature sensitivity, viewing angles, LCD transmission and extinction ratio, system limited dimensions and others, which may not provide all of the desired performance characteristics.

Microdisplays based on microLED technology could provide advantages over LCD microdisplays, such as self-emission, a larger color gamut, wide viewing angles, better contrast, faster refresh rate, lower power consumption (image dependent), and wide operation temperature range. Currently, microLED microdisplays are based on a standard Gallium Nitride (GaN) wafer, adopted from standard LEDs. This approach has the potential to provide high luminance display devices without lifetime issues at a relatively low price. In general, the standard GaN wafer is patterned into arrays of micro-LEDs. The microLED display is then produced by an integration of the micro-LED array and transistors. However, this approach has several manufacturing concerns including monolithic formation of the micro-LEDs over the transistors, pixel spacing, color generation, and spatial uniformity due to variations of color and luminance between the individual microLEDs.

OLED technology shares many of the attractive features of microLED technology for microdisplays. It is self-emissive, has excellent image quality, is very efficient compared to LCD or LCoS, and has an ultra-high color rendition and wide color space. Self-emissive OLED devices have the important advantage over backlight devices (such as LCD) in that each pixel only produces the intensity required by the image, whereas backlighted pixels produce maximum intensity followed by absorption of the unwanted light. Moreover, formation of an OLED over the transistors is much easier and lower cost than formation of a microLED because OLED layers can be vacuum deposited or directly coated on the transistor backplane. On the other hand, OLEDs can have limited luminance and lifetime.

It is also important for the control circuitry in OLED microdisplays, which are sample-and-hold type displays, to address the problem of motion blur (see https://www.blurbusters.com/faq/oled-motion-blur/; "Why Do Some OLEDs Have Motion Blur?", dated Dec. 28, 2018 and https://www.soundandvision.com/content/motion-resolution-issue-oled-tvs, "Is Motion Resolution an Issue with OLED TVs", dated Jan. 15, 2015).

The only way to reduce motion blur caused by sample-and-hold, is to shorten the amount of time a frame is displayed. This can be accomplished by using extra refreshes (higher Hz) or via black periods between refreshes (flicker). For OLED microdisplays, the best solution is to "shutter" the display image, either by turning off the entire active area at the same time or by a "rolling" technique, where only part of the displayed image is turned off at one time in a sequential manner. The "rolling" technique is preferred. The time that the pixels are turned off is very short and well below the threshold of detectability by the human eye in order to avoid perceivable flicker. This is accomplished in the control circuitry by the inclusion of a shuttering transistor, which when activated through a select line, prevents current from flowing through the OLED and turns the emission by the OLED pixel "off" for the desired period of time. In other words, the shuttering transistor is a switch transistor, in that it only turns the pixel "on" or "off" and does not regulate the voltage or current. However, this solution, where the pixels are turned off for part of the time that an image is displayed (generally referred to as the frame time), only increases the need for increased luminance by the OLED whenever it is "on" since it is the average luminance over the frame that is perceived by the eye. The shuttering to reduce motion blur can be applied to any method of supplying power to the OLED stack; for example, current control or PWM.

OLED microdisplays that utilize silicon backplanes are very attractive from the standpoint of cost and manufacturability. See, for example, Ali et al, "Recent advances in small molecule OLED-on-Silicon microdisplays", Proc. of SPIE Vol. 7415 74150Q-1, 2006; Jang et al, J. Information Display, 20(1), 1-8 (2019); Fujii et al, "4032 ppi High-Resolution OLED Microdisplay", SID 2018 DIGEST, p. 613; US2019/0259337; Prache, Displays, 22(2), 49 (2001); Vogel et al, 2018 48$^{th}$ European Solid-State Device Research Conference, p. 90, September 2018; and Wartenberg et al, "High Frame-Rate 1" WUXGA OLED Microdisplay and Advanced Free-Form Optics for Ultra-Compact VR Headsets", SID Proceedings, 49 (1), Paper 40-5, 514 (2018).

Microdisplays require very high luminance in order to be useful under all environmental conditions, such as outdoors in bright sunlight. Even under controlled environment conditions such as in VR googles, very high luminance is needed to create an immersive visual experience. Very high luminance from the display allows the use of lower efficiency optics that are smaller, lighter weight, and less expensive, producing a headset that is more competitive. Currently, state-of-the-art OLED microdisplays do not provide as much luminance as desired.

For example, a press release by one manufacturer of tandem OLED microdisplays describes full color products that may be able to deliver as much as 2.5 k nits, but admits that 5 k nits would be a more desirable goal (see https://www.kopin.com/kopin-to-showcase-latest-advances-in-its-lightning-oled-microdisplay-line-up-at-ces-2020/, dated Jan. 7, 2020). Some manufacturers propose that the goal should be 10 k nits or higher (see https://hdguru.com/calibration-expert-is-10000-nits-of-brightness-enough/, dated Jul. 26, 2018). A recent press release of Jun. 20, 2020 (https://www.businesswire.com/news/home/20200630005205/en/Kopin-Announces-Breakthrough-ColorMax %E2%84 A2-Technology-Unparalleled-Color) describes a tandem (2-stack) OLED display which emits >1000 nits. It also announces that "Further improvements in the brightness (>2000 nits) and color fidelity are expected through optimization of OLED deposition conditions. By incorporating a structure to enhance the output coupling efficiency, the brightness of the OLED microdisplay could be increased to >5000 nits within a couple of years.".

One solution for increasing the total amount of light emitted from OLED devices is to stack multiple OLED units on top of each other, so total light emitted from the stack is the sum of the light emitted by each individual unit. However, while the total light emitted from such OLED stacks is additive based on the total number of individual OLED light-emitting units, the voltage required to drive the OLED stack is also additive based on the voltages to drive each independent OLED unit. For example, if a light-emitting OLED unit requires 3 V to produce 250 nits at a given current, then a stack of two such units will require 6V to deliver 500 nits at the same current, a stack of 3 units will require 9V to deliver 750 nits and so forth.

OLED stacks are well known; for example, U.S. Pat. Nos. 7,273,663, 9,379,346, 9,741,957; 9,281,487 and US2020/0013978 all describe OLED stacks with multiple stacks of light-emitting OLED units, each separated by intermediate connection layers or charge generation layers. Springer et al, Optics Express, 24 (24), 28131 (2016) reports OLED stacks with 2- and 3-light-emitting units, where each unit has a different color. OLED stacks of up to six light-emitting units have been reported (Spindler et al, "High Brightness OLED Lighting", SID Display Week 2016, San Francisco Calif., May 23-27, 2016).

However, this approach of multi-stack OLED, which will require higher driving voltages, is difficult to apply in microdisplay applications. A problem is that the microdisplay also needs to have high resolution, requiring that the size of the individual pixels must be as small as possible and that the active (light-emitting) area of the microdisplay contain as many pixels as possible. This requires that the transistors in the control circuitry of the backplane be small, but yet of sufficient size to handle the required voltages and currents without permanent damage or current leakage.

Generally, as transistors get smaller, they have lower voltage ratings due to their inability to handle higher power because of the leakage current and other failure mechanisms. Smaller, lower-voltage transistors have thinner insulation layers at the gate, so they have more static current leakage as well. For this reason, larger transistors that are capable of handling higher voltages are generally used for OLED devices that require higher voltages. WO2008/057372 discusses the problems and prior art associated with the reduction of pixel circuit size in microdisplays. See also, for example, O. Prache, Journal of the Society for Information Display, 10(2), 133 (2002); O. Prache, "Active Matrix Molecular OLED Microdisplays, Displays, 22 49-56 (2001); and Howard et al, "Microdisplays based upon organic light emitting diodes", IBM J. of Res. & Dev., 45 (1), 15 (2001) discusses the need for microdisplays on silicon backplanes that provide high luminance with a large contrast ratio at low voltage.

Moreover, when using MOSFET p-channel transistors to provide a constant current from a power source at $V_{DD}$ to an OLED with the cathode voltage at $V_{CATHODE}$, the total voltage must be large in order to power the transistor and turn the OLED "on" to high brightness. However, if a low voltage p-channel transistor was used to control a 12V OLED, then when trying to turn off the OLED to create a black pixel, the current leakage through the transistor would be high and the OLED would continue to emit because $(V_{anode} - V_{cathode})$ will remain greater than the OLED threshold voltage. In OLED microdisplays, current leakage through the drive transistor(s) will reduce contrast because the OLED pixels will continue to emit light when they should remain dark. This effect will cause pure blacks (no emission) to become grey and decrease the magnitude of the tonal scale between pure black and pure white. This is undesirable.

There exists a need to increase the performance of OLED microdisplays on silicon backplanes by utilizing OLED stacks with high luminance and with high voltage requirements for light emission. However, the control circuitry on the silicon backplane must be able to handle the increased voltage and current demands without significantly increasing in size in order to maintain resolution and pixel pitch within the active area of the OLED. In particular, the control circuitry should maintain contrast by preventing or minimizing current leakage through the TFTs. Contrast is the difference in light emission when the pixel should be "off", "black", or non-emitting (typically, the image signal Code Value (CV)=0) and when the pixel should be fully "on", "white", or at maximum emission (typically, image signal CV=255).

It is common in the semiconductor foundry industry that manufactures backplanes that analog transistors with a 5V or less operating range are considered standard "Low Voltage" (LV) transistors. It is also common that there is generally a 10% safety limit on the voltage rating, allowing reliable operation without degradation of lifetime of the "5V transistors" up to 5.5V; this is high enough to allow for some degree of overvoltage in the OLED dynamic voltage range and the driving circuit overhead voltage. While the voltage limit applies generally between any pair of contacts to the transistor (gate, source, drain, body (also called bulk or well)), it specifically applies to the maximum gate-drain voltage such that the performance of the transistor remains within the specified range for typically 43,000 hours of operation under these conditions. Sometimes, depending on the design of the transistor, the voltage limit for other pairs of contacts can be higher (e.g., 7V) but this transistor is still referred to as a LV or 5V transistor. The 5V analog transistor is offered widely across the industry because of its compatibility with legacy TTL logic voltage levels for communications between Integrated Circuit (IC) chips. With the downward trend in the voltage for input-output communication (e.g., 3.3V and 1.8V standards) these 5V transistors are also occasionally referred to as Medium Voltage (MV) transistors, moving the LV label to the newer "lower-voltage" analog transistors. While relative labels like LV and MV may change over time, in this patent application, the term LV or "low-voltage" refers to a 5V rated transistor or lower, and the term MV or "medium-voltage" refers to transistors with voltage ratings over 5V. Higher voltage analog transistors are also commonly available, but the exact voltages are not as standardized across the IC fabrication industry as the 5V transistor. For example, higher voltage transistors are often needed for industries such as automotive.

Currently, silicon backplanes with low-voltage 5V drive transistors are available that use tandem (two light-emitting OLED units separated by one CGL) OLED stacks for light emission. See, for example, Cho et al, Journal of Information Display, 20(4), 249-255, 2019; https://www.ravepubs.com/oled-silicon-come-new-joint-venture/, published 2018; Xiao, "Recent Developments in Tandem White Organic Light-Emitting Diodes", Molecules, 24, 151 (2019). Such examples are insufficient in luminance for the needs of the technology.

Han et al, "Advanced Technologies for Large-Sized OLED Displays", Chapter 3, 10.5772/intechopen.74869 (2018). This review article describes the advances of three stack white OLED formulations as well as backplane technologies including those with two serially connected transistors, although separately and not in combination. This reference also notes that such two transistor backplanes are "difficult to adopt in large-sized high-resolution panels because of large line loads and a short charging time" and so, adapts a different kind of backplane circuitry for their devices.

Liu et al., J. Cent. South Univ. 19, 1276-1282 (2012) discloses a 3T1C circuit with two serially connected p-channel transistors in an OLED on Si chip microdisplay, Zeng et al, "A Novel Pixel Circuit with Threshold Voltage Variation Compensation in Three-Dimensional AMOLED on Silicon Microdisplays", P-27, SID 2019 Digest, p. 1313 describes a 4T1C pixel circuit for driving an AMOLED display on a silicon backplane. It discloses the use of two p-channel low-voltage transistors connected in series between a power source and an OLED. The first transistor is for driving the OLED and controls the current supplied to the OLED. The second transistor is a switch transistor for turning off the OLED during the program operation. The above circuit also contains additional transistors to determine and compensate for $V_{th}$ variations.

U.S. Pat. No. 9,066,379 describes control circuitry suitable for an OLED microdisplay. It discloses the use of two p-channel low-voltage transistors connected in series between a power source and an OLED. The first transistor is for driving the OLED and controls the current supplied to the OLED. The second transistor is a switch transistor for shuttering (turning off) the OLED. The circuit also requires a third transistor, which is a medium or high voltage p-channel transistor, between the switch transistor and the OLED. The purpose of this third transistor appears to be the prevention of current flow to the OLED whenever ($V_{ss}$ − $V_{cathode}$) is greater than the OLED threshold voltage during the "off" period of the OLED.

Pashmineh et al, "High-voltage circuits for power management on 65 nm CMOS", Adv. Radio Sci., 13, 109-120, 2015 describes high-voltage circuits based on serially connected (also commonly referred to as "stacked" transistors) stacked low-voltage CMOS transistors.

Dawson et al, "The Impact of the Transient Response of Organic Light Emitting Diodes on the Design of Active Matrix OLED Displays", International Electronic Devices Mtg 1998, 875-878, describes a pixel circuit with two serially connected p-channel transistors.

Kwak et al, "Organic Light-Emitting Diode-on-Silicon Pixel Circuit Using the Source Follower Structure with Active Load for Microdisplays", Japanese Journal of Applied Physics, 50, 03CC05 (2011), describes a pixel circuit that has three serially connected p-channel transistors and an overvoltage protection circuit. This reference notes that "an overvoltage protection circuit" is required to prevent the breakdown of the metal oxide semiconductor field-effect transistors (MOSFETs) because the operating voltage of OLEDs is higher than that of MOSFETs. U.S. Pat. Nos. 5,760,477 and 9,066,379 also describe the use of a protection circuit.

Vogel et al, SID 2017 DIGEST, Article 77-1, pp 1125-1128 discloses the use of a protection circuit in a low-voltage OLED Si microdisplay to extend the OLED voltage operating range.

Other references that include over-voltage protection for OLEDS are disclosed in U.S. Pat. No. 6,580,657, WO2009072205 and CN200488960. U.S. Pat. Nos. 9,059,123, 9,299,817, 9,489,886, US20080316659 and US20200202793 disclose the use of n-p junction diodes such as bipolar junction transistors in the pixel control circuits of OLED displays.

Additional patent references that disclose two serially connected transistors include: CN109166525, US20140125717, U.S. Pat. Nos. 7,196,682, 6,229,506, 9,262,960, 7,443,367, 6,930,680, U.S. Ser. No. 10/614,758, WO2019019590, U.S. Pat. Nos. 6,946,801, 7,755,585, 8,547,372, 8,786,591, 8,797,314, 9,818,344, US2018/0211592 and U.S. Ser. No. 10/269,296. The following references disclose pixel circuits with three serially connected transistors: U.S. Pat. Nos. 9,324,266, 9,384,692, U.S. Ser. No. 10/600,366, U.S. Pat. Nos. 7,180,486, 9,858,863 and US20190279567.

U.S. Pat. Nos. 9,059,123 and 9,489,886 disclose the use of n-p junction diodes such as bipolar junction transistors in the pixel control circuits of OLED displays.

SUMMARY

Described is a microdisplay comprising a light emitting OLED stack on top of a silicon-based backplane with individually addressable pixels and control circuitry wherein the light emitting OLED stack has three or more OLED units between a top and a bottom electrode; and the control circuitry of the silicon-based backplane comprises, for each individually addressable pixel, at least two transistors with their channels connected in series between an external power source $V_{DD}$, and the bottom electrode of the OLED stack.

The microdisplay as above wherein the threshold voltage $V_{th}$ of the light emitting OLED stack is at least 7.5V or greater or preferably, at least 10 V or greater.

Any of the microdisplays above wherein the OLED stack comprises four or more OLED light-emitting units.

Any of the microdisplays above wherein the OLED light-emitting units are each separated from each other by a charge-generation layer (CGL), or wherein the bottom electrode is segmented and each segment is in electrical contact with the control circuitry in the backplane, or wherein the OLED stack is top-emitting.

Any of the microdisplays above wherein the OLED stack forms a microcavity where the physical distance between the segmented bottom electrode and the top electrode is constant across all pixels.

Any of the microdisplays above where the transistors with their channels connected in series are both rated at 5V or lower, or where the transistor closest to the power source is a driving transistor and is rated at 5V or lower and the transistor closest to the bottom electrode of the OLED is a switch transistor and is rated at greater than 5V.

Any of the microdisplays above wherein the two transistors with their channels connected in series are both p-channel transistors, or wherein the two transistors with their channels connected in series are each located in separate wells.

Any of the microdisplays above wherein the control circuitry additionally comprises a protection circuit with a p-channel transistor or a diode. The protection circuit can comprise a p-n diode and wherein the cathode of the p-n junction diode is connected to the node of the bottom electrode of the OLED stack and the anode is connected to a voltage reference $V_{REF}$ or a current reference $I_{REF}$.

The protection circuit described above where the diode is a bipolar junction transistor. The bipolar junction transistor can be a NPN transistor wherein the base is connected either to a voltage source $V_{PROTECT}$ or a current source $I_{PROTECT}$, the emitter is connected to a node connected to the bottom electrode of the OLED stack and the collector is connected to voltage source $V_{DD}$. The base of the BJT can be isolated.

The protection circuit above where the bipolar junction transistor is located in a separate well from the two transistors whose channels are connected in series, or wherein the two transistors with their channels connected in series are both p-channel transistors and are each located in separate n-wells and the bipolar junction transistor is a NPN transistor located in a separate p-well.

Any of the microdisplays as described above which additionally comprises an RGB color filter array (CFA) located on top of the OLED stack, wherein the individual R, G, B color filters are in register with the segmented bottom electrode in order to create R, G, B pixels; or which additionally comprises a RGBW color filter array (CFA) located on top of the OLED stack, where the individual R, G, B and transparent or missing color filters are in register with the segmented bottom electrode in order to create R, G, B and W pixels.

The microdisplays provide very high luminance and contrast with a small pixel-pitch dimension.

DETAILED DESCRIPTION

Figure 1:
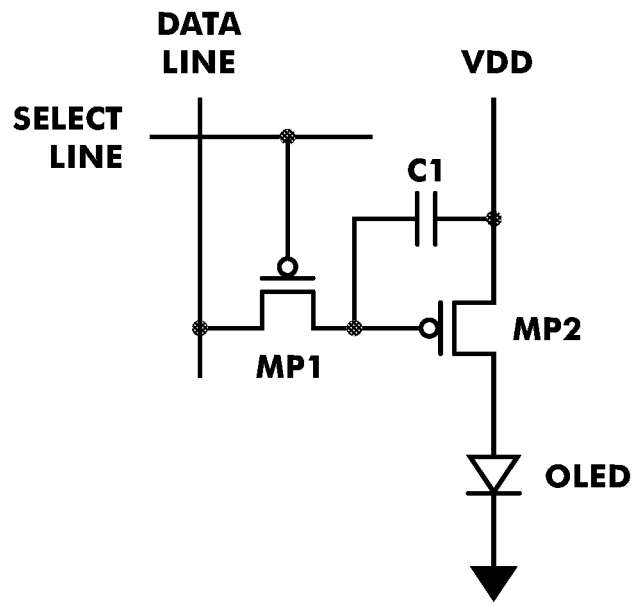
FIG. 1 shows a simple prior art control circuit for an OLED.

For the purposes of this disclosure, the terms "over" or "above" mean that the structure involved is located above another structure, that is, on the side opposite from the substrate. "Top", "uppermost" or "upper" refers to a side or surface further from the substrate while "bottom", "bottommost" or "bottom" refers to the side or surface closest to the substrate. Unless otherwise noted, "over" should be interpreted as either that the two structures may be in direct contact or there may be intermediate layers between them. By "layer", it should be understood that a single layer has two sides or surfaces (an uppermost and bottommost); in some instances, "layer" may represent multiple layers that are considered as a whole and is not limited to a single layer.

For light-emitting units or layers, R indicates a layer that primarily emits red light (>600 nm, desirably in the range of 620-660 nm), G indicates that a layer primarily emits green light (500-600 nm, desirably in the range of 540-565 nm) and B indicates a layer that primarily emits blue light (<500 nm, desirably in the range of 440-485 nm). It is important to note that R, G and B layers can produce some degree of light outside the indicated range, but the amount is always less than the primary color. Y (yellow) indicates that a layer that emits significant amounts of both R and G light with a much lesser amount of B light. "LEL" means light-emitting layer. Unless otherwise noted, wavelengths are expressed in vacuum values and not in-situ values.

An individual OLED light-emitting unit can produce a single "color" of light (i.e., R, G, B, or a combination of 2 or more primary colors such as Y, C (cyan), or W (white)). The single color of light may be generated within the OLED unit by a single layer with one or more emitters of the same color or multiple layers, each with the same or different emitters whose primary emission fall within the same color. A single OLED unit can also provide a combination of two colors (i.e., R+G, R+B, G+B) within a single OLED unit by having: one layer with a single emitter that emits two colors of light, one layer with two different emitters, or combinations of multiple separate layers, each emitting a single, but different, color. A single OLED unit may also provide white light (a combination of R, G and B) by having: one layer that emits all three colors of light or combinations of multiple separate layers, each emitting a single (but different) color, the sum of which is white. The individual OLED light-emitting units may have a single light-emissive layer or may have more than one light-emitting layer (either directly adjacent to each other or separated from each other by an interlayer). The individual light-emitting units may also contain various kinds of non-emitting layers such as hole transporting layers, electron-transporting layers, blocking layers and others known in the art to provide desirable effects such as promoting emission and managing charge transfer across the light-emitting unit.

Because OLED light-emitting units can comprise multiple layers, an individual unit is sometimes referred to as "stacks" which can be confused with a OLED device with multiple units. In this application, a "stacked" OLED has at least two OLED light-emitting units stacked on top of one another over a substrate so there are multiple sources of light within the device. In the stacked OLEDs of the invention, individual OLED light-emitting units are separated from each other by a charge-generation layer (CGL) and not by separately and independently controlled intermediate electrodes. To be considered an OLED light-emitting unit, it must be separated from another light-generating unit by a CGL. Thus, a light-emitting layer adjacent to one of the OLED light-emitting units but not separated from it by a CGL, is not considered to count as a separate unit. Within the stack, all or some of the individual OLED light-emitting units may be the same or they all may be different from each other. Within the OLED stack, the individual OLED light-emitting units can be placed in any order between the top and bottom cathodes. The stacked OLED may be monochromatic (every pixel of the OLED stack primarily emits the same color of light; for example, green light) or may have multimodal emission (either where every pixel emits 2 or more colors of light (for example, yellow or white) or where different pixels emits different colors of light so that the overall emission contains 2 or more colors of light).

In some cases, the threshold voltage ($V_{th}$) of the OLED stack can be estimated by linear extrapolation of the I-V curve after significant light emission begins back to the voltage axis. Because this method is not exact because I-V response curves for OLEDs may not be completely linear over their response ranges, values calculated in this manner are not exact. A general range for this metric is +/−10%. More accurately, the threshold voltage can be defined as the voltage where the current density is no more than 0.2 $mA/cm^2$ of the exposed anode layer, and there is at least some reliable detectable luminance; that is, at least 5 cd/A. This is the method used in this application.

In the following, transistors may be referred to as being "on" or "off". In an "off" transistor, the signal sent to the gate is intended so that no current will be passed through the terminals; in other words, the signal (typically, CV=0) is an indication that the signal calls for no current to pass through that transistor so that instead of being switched "off", the transistor is regulated to be "off". In such cases, even though a transistor may be "off", there still may be some current leakage. Likewise, in an "on" transistor, the signal sent to the gate is intended so that at least some current will be passed through the terminals; in other words, the signal (typically, CV=greater than 0 but less than 255) is an indication that the image calls for some degree of emission from that pixel so that instead of being switched "on", the transistor is regulated to be "on". In a similar way, pixels or OLEDs may be referred to as being "on" or "off" as according to the requirements of the image and so the appropriate signals are sent to the pixel or OLED.

Silicon backplanes are derived from a silicon wafer (also called a slice or substrate). They are a thin slice of semiconductor, such as a crystalline silicon (c-Si), used for the fabrication of integrated circuits. The wafer serves as the substrate for microelectronic devices built in and upon the wafer. It undergoes many microfabrication processes, such as doping, ion implantation, etching, thin-film deposition of various materials, and photolithographic patterning. Finally, the individual microcircuits are separated by wafer dicing and packaged as an integrated circuit. Wafers are grown from crystal having a regular crystal structure, with silicon having a diamond cubic structure with a lattice spacing. When cut into wafers, the surface is aligned in one of several relative directions known as crystal orientations. Silicon wafers are generally not 100% pure silicon, but are instead formed with an initial impurity doping concentration of boron, phosphorus, arsenic, or antimony which is added to the melt and defines the wafer as either bulk n-type or p-type. For background, see Chapter 7 in "Flat Panel Display Manufacturing", Souk, L., Ed., 2018. It is desirable that the silicon backplane be a single-crystal Si wafer.

In order to provide control circuitry for the operation of the stacked OLED, thin-film transistors (TFTs) along with other components such as capacitors, resistors, connecting wires or bus bars, and the like are provided on the surface of the silicon wafer. For example, see T. Arai, "High Performance TFT Technologies for the AM-OLED Display manufacturing", Thesis, Nara Institute of Science and Technology, 2016; M. K. Han, Proc. of ASID '06, 8-12 October, New Delhi; U.S. Pat. No. 9,066,379; and U.S. Ser. No. 10/163,998. It should be understood that the TFTs may or may not incorporate the silicon wafer as part of the TFT structure or may be prepared from separate materials deposited on the surface.

TFTs can be made using a wide variety of semiconductor materials. The characteristics of a silicon-based TFT depend on the silicon's crystalline state; that is, the semiconductor layer can be either amorphous silicon, microcrystalline silicon, or it can be annealed into polysilicon (including low-temperature polysilicon (LTPS) and laser annealing).

The manufacture of silicon backplanes with suitable control circuitry is a very well known, understood and predictable art. However, because of the cost and complexity of the manufacturing process and equipment, it is often not practical to build facilities to manufacture a particular backplane. Instead, a foundry model was been widely adopted in the industry where the functional characteristics of microelectronic devices have become more standardized. This standardization allowed design to be split from manufacture. A design that obeyed the appropriate design rules could be more easily and cheaply manufactured by different companies that had compatible manufacturing methods. For this reason, the control circuitry on silicon backplanes is generally limited to the use of standard components selected from a range of options provided by the manufacturer of the backplane. For example, a manufacturer of silicon backplanes may provide the option of incorporating various standard designs of transistors rated at 1.8V, 2.5V, 3.3V, 5V, 8V and 12V into a customer's design, but would not be able to provide (without great expense) transistors that are not included in the offered designs.

For the purposes of this application, "Low-Voltage" (LV) is defined as those analog microelectronic components that are sized, designed and rated to safely and reliably operate at 5V or less. "High-Voltage" (HV) microelectronic devices are generally considered to be in the range of 18-25V. "Medium-Voltage" (MV) microelectronic devices are generally considered to be those in between LV and HV. It should be noted that these voltage ratings are set by the manufacturers and the manufacturers do not recommend exceeding the set maximum voltage for each transistor.

Complementary metal-oxide-semiconductor (CMOS) technologies use p-type and n-type metal-oxide-semiconductor field-effect transistors (MOSFETs) to realize complex integrated circuits. Depending on the manufacturing process, there are different voltage domains available (i.e., 1.8V, 2.5V, 3.3V, 5V, 12V etc.). In all voltage domains, the MOSFET transistors have a drain, source, gate and bulk/well. The base of the MOSFET is the substrate; for a n-channel FET, the substrate is a p-type doped substrate or well with low doping rate; for a p-channel FET, the substrate is a n-type doped well with low doping rate. Source and drain regions are formed from highly doped regions with n or p-type for n-channel or p-channel FETs. The controlled channel is formed between the source and drain, isolated with a thin oxide and typically covered with a layer of poly-silicon acting as a gate. All four terminals of the FET (source, drain, gate, substrate/well) are connected by metal contacts to metal interconnection layers which eventually connect to the OLED.

The emission area of a microdisplay is small and in order to achieve the necessary pixel pitch, the space available for the control circuitry for each pixel is limited. For a full-color microdisplay, the space occupied by the control circuit for each individual pixel should be no more than 100 square microns and preferably no more than 50 square microns. For a monochrome microdisplay where all pixels emit the same color, the space for the control circuitry can be 3-4× larger since fewer pixels are needed.

In a suitable low voltage 5V transistor, the maximum voltage between any pair of all terminals may not exceed 5V without damaging the device. A typical safety margin of 10% overvoltage is acceptable for a short period. A medium-voltage transistor rated at greater than 5V (for example, one rated at 7.5V) has in general the same setup as a 5V transistor but has a thicker gate oxide and larger geometries (channel width and length) to withstand higher voltages. Thus, MV transistors will generally be larger and occupy more space than a corresponding LV transistor.

Although transistors can be made in any size range without regard to their voltage rating, a low-voltage MOS transistor rated at 5V suitable for microdisplay applications has a total area of no more than 20 square microns, and preferably no more than 10 square microns. A suitable channel area (channel length×channel width) for a 5V transistor for microdisplay applications should be no more than 1 square micron and preferably, no more than 0.30 square micron. The two transistor contacts should be each be no more than 1 square micron and preferably, no more than 0.30 square micron.

For the purposes of this application, a suitable BJT for the protection circuit is where the general setup is vertical for both NPN and PNP types. For a NPN BJT, the collector is formed as low doped deep n-well inside the common silicon substrate (bulk) with low p-doping. The base is formed as p-well inside the deep-n-well and is connected by a highly doped p-region. The emitter of the BJT is formed of a highly doped n-region inside the p-well. The typical size of the emitter region is about 500 nm×500 nm and preferably, no more than 0.30 square micron to allow small pixel sizes. The maximum voltage between any pair of all terminals of the BJT (bulk, base, emitter, collector) may not exceed 5V without damaging the device. A typical safety margin of 10% overvoltage is acceptable for a short period.

OLED microdisplays (often called "AMOLEDs") consist of an active matrix of OLED pixels, which generate light (luminescence) upon electrical activation, that have been deposited or integrated onto a transistor array located on a silicon chip, where the array functions as a series of switches to control the current flowing to each individual pixel. Typically, this continuous current flow is controlled by at least two transistors at each pixel (to trigger the luminescence), with one transistor to start and stop the charging of a storage capacitor along with controlling the other transistor where this other transistor provides a voltage source at the level needed to create a constant current to the pixel. In some embodiments, the transistor (generally referred to as a scan or select transistor) which controls the current provided by the other transistor (generally referred to as a drive transistor) is controlled by a select line which is common across all pixels along a row. The signal which is passed by the scan transistor is supplied by a data line, which is common across all pixels in a column.

This is illustrated in FIG. 1, which represents the simplest form of prior art AMOLED pixel design. The simplest AMOLED pixel which has pixel memory uses two transistors and one capacitor. The current-driving transistor MP2 is conventionally connected from the supply voltage $V_{DD}$ to the anode of OLED. One transistor (MP2) drives the current for the OLED and another transistor MP1 (also known as a scan transistor) acts as a switch to sample and hold a voltage onto the storage capacitor C1 as shown. There is a data line (supplying VDATA) that controls the current $V_{DD}$ passing through the driving transistor MP2. There is a select line that controls MP1 and thus, the charging of the capacitor C1. In general, the transistors have intrinsic capacitance, so additional capacitance may not be needed depending on the intrinsic capacitance of the transistors and the leakage currents through the transistors.

In the figures after FIG. 1, any capacitors present have been omitted from the drawings for clarity. The presence of a capacitor is optional and the circuit may have no capacitors or any number of capacitors as desired. The reference voltage for the capacitor can be $V_{DD}$ or some other voltage.

It is noted that variations in the threshold voltage ($V_{th}$), carrier mobility, or series resistance will directly impact the uniformity of the current of OLED driving TFT and consequently the brightness of the display. One major factor affecting the non-uniformity current is the threshold voltage ($V_{th}$) variation of the OLED drive transistors. Other types of compensation by the control circuitry may be needed for the pixels; for example, aging, degradation or burn-in of the OLED materials over time, mura or non-uniformity across the active area, or voltage drop in the metal connecting lines. In addition, the control circuitry provided by the TFTs may need to control the timing of the current delivered to the pixels as, for example, by PWM. The design of control circuitry for OLEDs that includes various types of compensation and driving schemes has been a subject of intense interest and many approaches have been proposed. Such compensation circuits may additionally be present in the control circuitry for the stacked OLED with 3 or more stacks.

It has been unexpectedly found that the high voltage/current required by OLED stacks with 3 or more stacks can be handled by a control circuit that comprises at least two transistors with their channels connected in series. This is sometimes referred to as 'stacked transistors". Desirably, one of the serially connected transistors is a low-voltage driving transistor and the other is a switch transistor. This arrangement allows for driving the OLED pixel without significant current leakage through the TFTs so that high brightness is obtained without loss in contrast.

In particular, the driving TFT and the switch transistor are connected in series, so that a first terminal of the driving transistor is electrically connected (and is closer to) to an external power source, a second terminal of the driving transistor is electrically connected to a first terminal of the switch transistor and a second terminal of the switch transistor is electrically connected to (and closer to) the bottom electrode of the OLED stack. Such an arrangement allows for the OLED stack to be operated at a higher voltage than the individual transistors are designed for without significant amounts of current leakage or physical damage to the low-voltage transistors.

Figure 2:
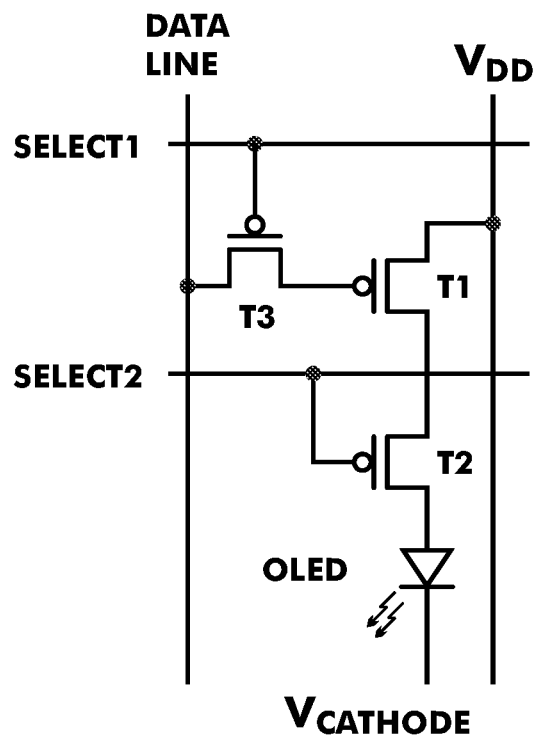
FIG. 2 shows a basic control circuit with two transistors with their channels connected in series which is suitable for an OLED stack with at least three OLED units.

This basic control circuit arrangement is shown in FIG. 2 where a p-channel driving transistor T1 is connected to $V_{DD}$ (external power source) on a first terminal (for p-channel transistors, the source) and connected on a second terminal (in p-channel transistors, the drain) to a switch transistor T2. The gate of the driving transistor T1 is controlled via the data line and an in-line selecting transistor T3, whose gate is controlled by a select line SELECT1. Switch transistor T2 receives current from the second terminal of T1 (when T1 is turned "on") on a first terminal (the source) and is connected on a second terminal (the drain) to the bottom electrode of the OLED. The gate of the switch transistor T2 is controlled directly by select line SELECT2. Both the driving transistor T1 and the switch transistor T2 are connected in series. When both T1 and T2 are selected to be "on", current flows to the bottom electrode of the OLED stack and it emits light. If T2 is selected to be "off", then no current will flow to the OLED stack, without regards to whether T1 is "on" or "off". In some embodiments, the switch transistor T2 can provide a shuttering function to prevent motion blur. If T1 is "off", it does not matter if T2 is "on" or "off"; the OLED will not emit.

In FIG. 2, the control circuitry of the backplane with at least two serially connected transistors between $V_{DD}$ and the bottom electrode of the OLED electrode are a driving transistor and a switch transistor. In this application, a drive transistor has the function for regulating the voltage and current flowing to the OLED pixel at an appropriate level according to the image being displayed and a switch transistor has the purpose of switching the current flowing to the OLED pixel on and off in order to provide a shuttering function. For example, during operation of the microdisplay, the switch transistor T2 interrupts power flowing from the driving transistor T1 to the bottom electrode of the OLED stack so there is no emission (black) for part of the frame time. This is different from the scan transistor T3 which is only on for a very small part of the frame time (e.g., 1/1200 for a display with 1200 rows) in order to charge a storage capacitor (not shown in FIG. 2). Often, for the same maximum operating voltage, a switch transistor may be smaller in size than a drive transistor. However, if the switch transistor is required to handle higher voltages as in the control circuitry for an OLED with 3 or more stacks, it may be larger than the drive transistor and be rated at a higher voltage.

Desirably, the driving transistor (T1) is located closer to the power source $V_{DD}$ than the switch transistor (T2) which is located closer to the bottom electrode of the OLED. It is preferred that at least the driving transistor is a p-channel MOSFET transistor and more preferably, both the driving and switch transistors are p-channel MOSFET transistors. The two serially connected transistors can be both LV, both MV, or one LV and one MV transistor. Preferably they are both LV transistors to decrease the oversize of the pixel circuit. However, in some embodiments, the driving transistor is LV while the switch transistor is MV.

Although only p-channel transistors are illustrated in FIG. 2, n-channel transistors, or a mixture of n-channel and p-channel transistors can be used. In such cases, it will necessary to rearrange the circuitry appropriately in account for the differences in polarity between n- and p-channel transistors. Moreover, other microelectronic components such as other transistors, capacitors and resistors may be included in this control circuit as necessary.

Figure 3:
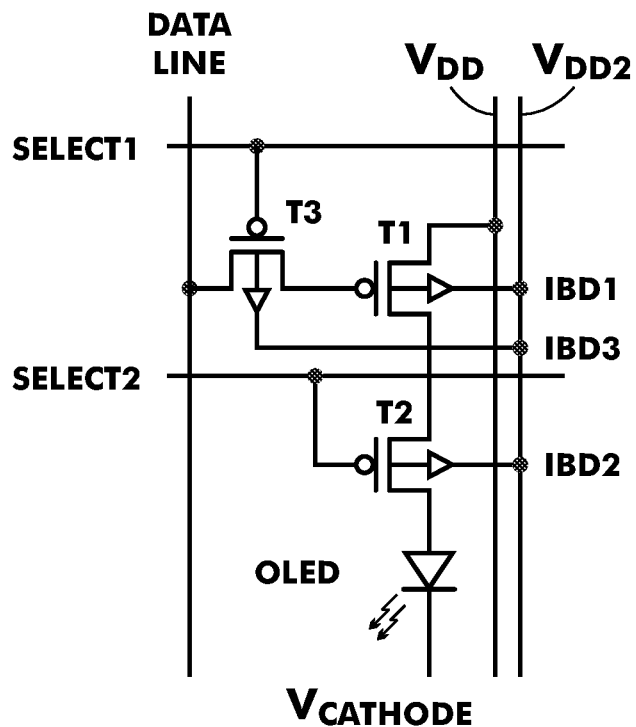
FIG. 3 shows one embodiment for the intrinsic body diode connections of FIG. 2.

As is known in the art, MOSFET transistors require an intrinsic body diode connection to perform as desired. Due to the structure of a MOSFET transistor, a parasitic diode is inherently present and it can affect the operation of the transistor. Commonly, the intrinsic body diode is connected to a power source, either internally or externally, to apply a bias. These body connections are also referred as "bulk connections" or "transistor wells" as well as other terms. This is shown in FIG. 3 where IBD1, IBD2, and IBD3 are the intrinsic body diode connections (for T1, T2 and T3) to a separate voltage source $V_{DD2}$. These transistors can share the same well for the intrinsic body diode connection. However, the same power source $V_{DD}$ used to supply power to T1 and T2 could be used for the IBDs as well; that is $V_{DD}$ and $V_{DD2}$ are a common source.

However, it can be desirable that one or more of the transistors are floating in its own separate well on the Si backplane to avoid going outside the operating voltage range of any of the components. In particular, when both the first driving transistor and the switch transistor are p-channel transistors, each transistor can be located in its own separate n-well. This permits a larger dynamic voltage range for the control of the OLED than can be achieved with both transistors in the same n-well. The use of isolated, floating or different wells for serially connected transistors is known in the art; for example, see U.S. Pat. Nos. 9,066,379, 5,764,077, 7,768,299, 9,728,528 and JP2016200828.

Figure 4:
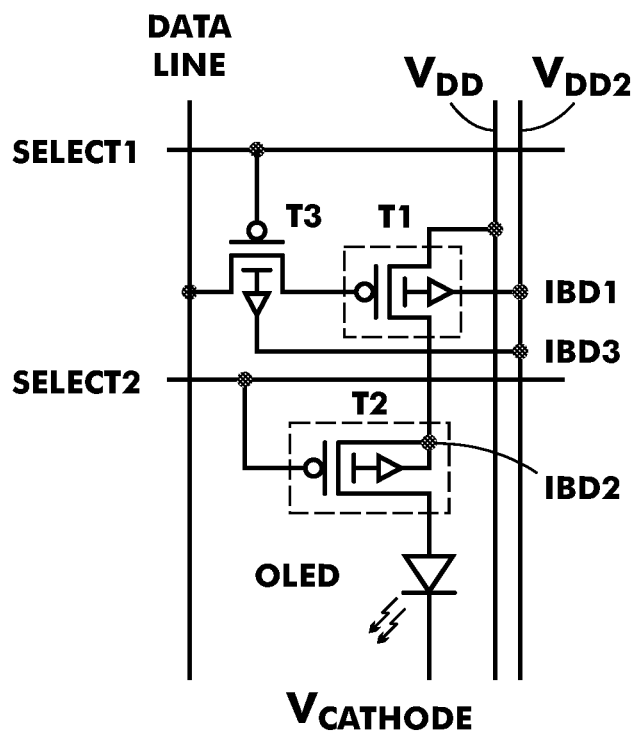
FIG. 4 shows another embodiment for the intrinsic body diode connections of FIG. 2.

This is illustrated in FIG. 4 where T1 occupies its own well, as indicated by the dotted lines, and is biased through a connection to $V_{DD2}$ via IBD1 and T2 occupies a different well, as indicated by the dotted lines, which is biased by a different separate connection IBD2 to the transistor source ($V_{DD}$). In the embodiment of FIG. 4, the bias applied to each IBD is different and so, each n-well is independent of each other.

The embodiments shown in FIGS. 2-4 have several advantages in its design and operation for driving an OLED with 3 or more stacks. In design, this circuit can be very compact because all transistors are relatively small LV transistors, commonly found at most foundries. All transistors can be p-channel transistors with all the n-wells biased to $V_{DD}$ which eliminates the need for isolated or floating wells. These features can allow a very compact pixel circuit design for microdisplay designs with very high resolutions in small sizes.

Figure 5A:
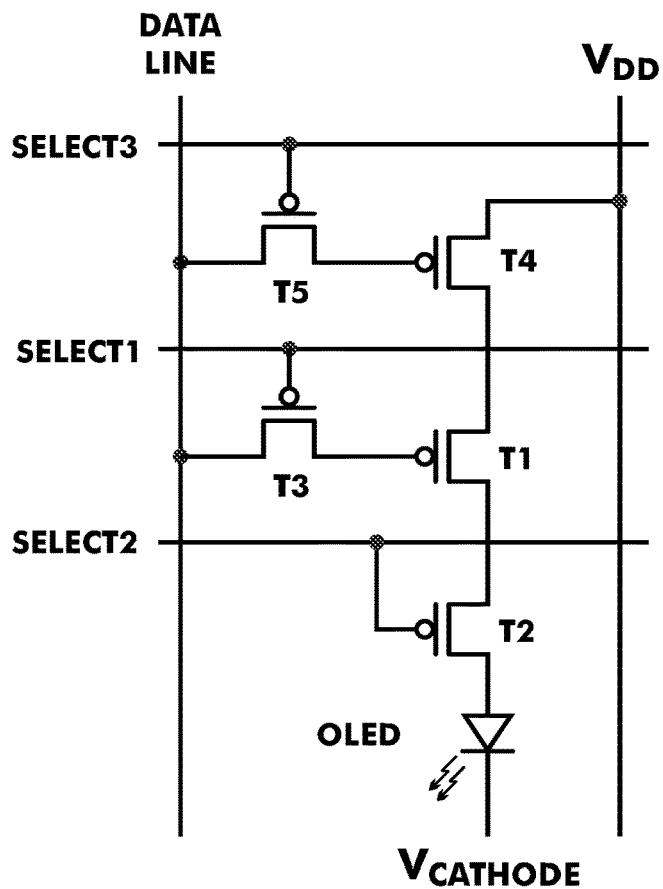
FIG. 5A shows a basic control circuit with three transistors with their channels connected in series which is suitable for an OLED stack with at least three OLED units.

FIG. 5A shows a control circuit with three transistors in series. The circuit shown in FIG. 5A is similar to that shown in FIG. 2 except that there is a third transistor T4 is connected in series between the power source $V_{DD}$ and the source of the driving transistor T1. As shown, the gate of T4 is controlled via the data line and an in-line selecting transistor T5, whose gate is controlled by a select line SELECT3. The lines SELECT2 and SELECT3 in FIG. 5A may supply a signal at the same or different voltages, may be switched simultaneously or at different times, or may be left unswitched depending on the operating conditions.

Desirably, the added transistor T4 can be a second drive transistor so that between the power source $V_{DD}$ and the bottom electrode of the OLED are two drive transistors (T4 and T1) and one switch transistor (T2), all in series. In this case, the signal supplied to the gate of T4 may also be the same as that to T1 and may be supplied via T3/SELECT1. While FIG. 5A shows a design with one data line and two select lines for data control, a similar design is possible with two data lines and one select line.

In embodiments where there are three or more transistors in series, they can be a combination of both LV and MV transistors. Preferably, they are all LV transistors to decrease the size of the pixel circuit. These multiple transistors can be p-channel, n-channel or a mixture. It is preferred that all are p-channel. If there is a mix of n-channel and p-channel transistors, then preferably there is at least one drive transistor that is a p-channel transistor and more preferably, it is a LV transistor. Switch transistors are preferable LV transistors; however, when necessary to expand the operating range of the backplane circuit while observing the voltage limitations of the individual transistors, it may be desirable to use one or more MV switch transistors.

In the case that the any of the multiple transistors in series are of one type, then the multiple common transistors of the same type can share the same well to reduce the size of the design. However, to expand the operating range of the backplane circuit while observing the voltage limitations of the individual transistors, it may be necessary to put the transistors of the same type in separate well regions.

Figure 5B:
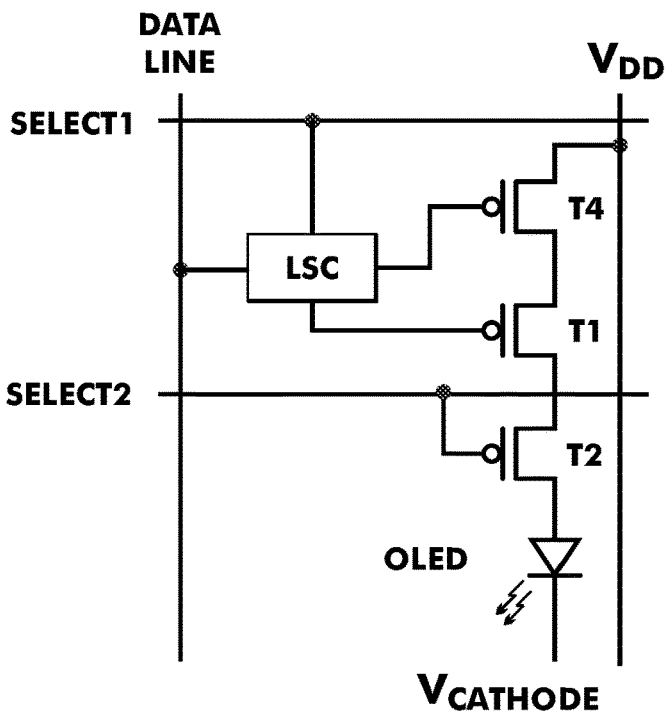
FIG. 5B is similar to FIG. 5A except that the drive transistors are controlled via a Level Shift Circuit.

FIG. 5B shows a schematic for a control circuit with two drive transistors similar to that shown in FIG. 5A where the two drive transistors are controlled by a level shift circuit (LSC). A level shift circuit is a circuit used to translate signals from one logic level or voltage domain to another and is often used to resolve the voltage incompatibility between various parts of a system. For clarity, neither the internal components nor all of the connections (e.g., $V_{DD}$, ground and other possible input connections) to the LSC are shown. In this embodiment, the LSC sets the gate voltages for the drive transistors T4 and T1 based on the signal SELECT1 and the signal from the data line so that the total voltage across T4 and T1 is split approximately equally between the two drive transistors at all times. As known, small logic transistors can be used for this function.

OLED based microdisplays often contain a protection circuit in MOSFET based control circuitry of the backplane to limit the amount of power flowing through the transistors to prevent damage. It is desirable to include a protection circuit in the control circuitry of the backplanes of microdisplays with OLEDs having 3 or more stacked units for this purpose because of the relatively high power required to cause emission from such devices. A protection circuit should maintain or "clamp" the voltage at the bottom electrode of the OLED so that it doesn't go below a desired voltage level when the OLED is not emitting. Such protection circuits may also be called "voltage maintenance" circuits.

In order to protect the low-voltage transistors present in the control circuitry and remain within the specified operation range of the transistors as set by the foundry, it would be desirable for the protection circuit to maintain a black level current (CV=0 or pixel is "off") at the bottom electrode of the stacked OLED for the pixel below 4 μA/cm2, or more desirably at 2 μA/cm2 or less for 3-unit stacked OLEDs with a Vth of approximately 7.5V. For 4-unit stacked OLED devices, similar black level currents are desired, and a typical Vth is approximately 10V.

Figure 6:
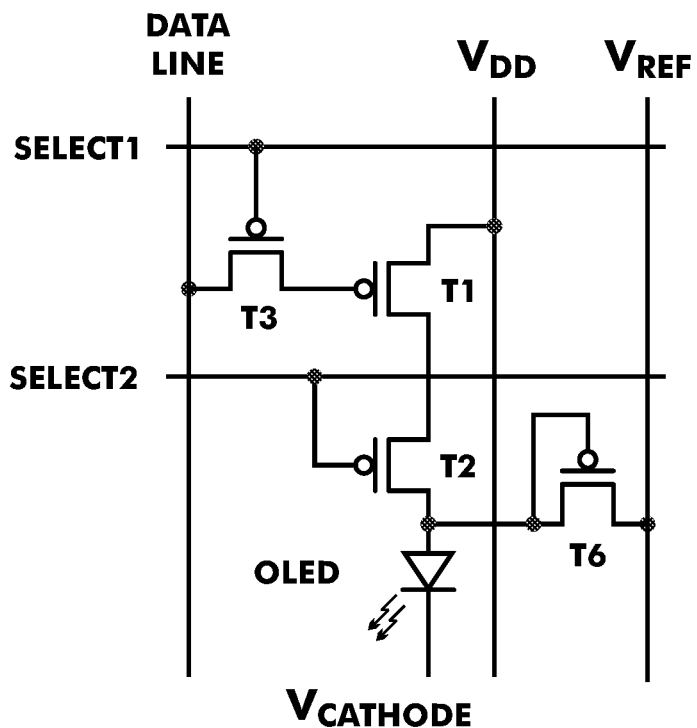
FIG. 6 shows a basic control circuit suitable for an OLED stack with at least three OLED units with an additional protection circuit comprising a diode-connected p-channel MOSFET transistor.

FIG. 6 shows a schematic control circuit similar to that shown in FIG. 2 with the addition of a protection circuit. In this particular embodiment, the protection circuit comprises a p-channel transistor connected on one end to a node located between the drain of T2 and the bottom electrode of the OLED and connected to a power source (in this example, a reference voltage $V_{REF}$ (common across all pixels)) on the other end. The gate of T6 is also connected to the node. Thus, the diode-connected transistor T6 limits the lowest drain voltage of T2 to prevent its breakdown. There may be other electronic components as part of this circuit which are not shown. This arrangement is similar to that described by Kwak et al. except that one end of the p-channel transistor is connected to ground instead of $V_{REF}$.

However, the problems caused by the higher voltage requirements of using an OLED with 3 or more units still apply to the use of a protection circuit using a MOSFET transistor such as shown in FIG. 6. In this embodiment, using a LV or MV MOSFET transistor (i.e., T6) to achieve protection of the LV drive and switch transistors does not result in a significantly smaller pixel design compared with using a MV drive and switch transistors and eliminating the protection circuit.

Figure 7:
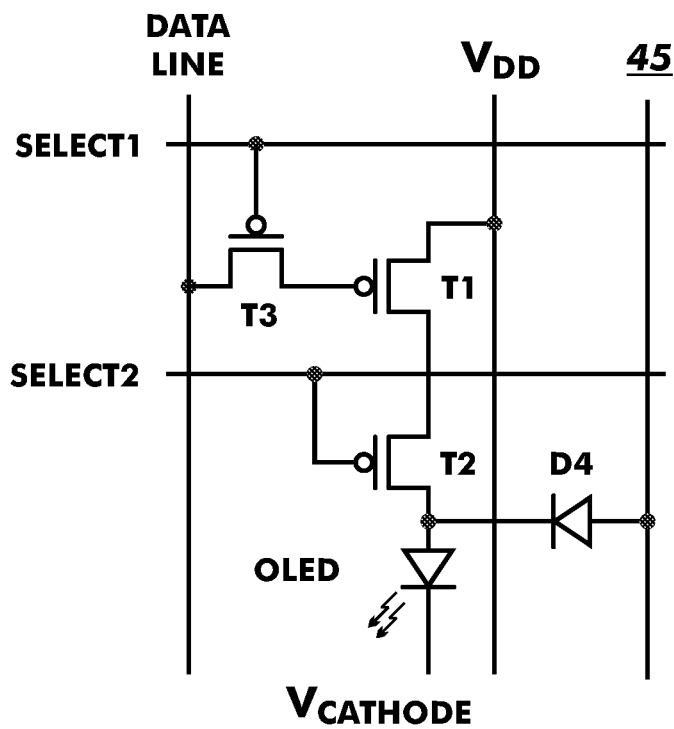
FIG. 7 shows a similar protection circuit comprising a diode.

FIG. 7 shows a protection circuit similar to that shown in FIG. 6 except that the p-channel transistor T6 is replaced by a diode D4. Desirably, the diode D4 in the protection circuit is a p-n junction diode. A p-n diode is a circuit element that allows a flow of electricity in one direction but not in the other (opposite) direction. P-n diodes may have a forward bias in the direction of easy current flow or a reverse bias where there is little or no current flow. Such p-n diode could be formed inside the CMOS project in different ways; for example, as a vertical diode with highly doped p-region in a n-well. On one end, D4 is connected to a node located between the drain of T2 and the bottom electrode of the OLED and on the other end, is connected to a power source 45, which is either a reference voltage $V_{REF}$ or a reference current $I_{REF}$.

Figure 8:
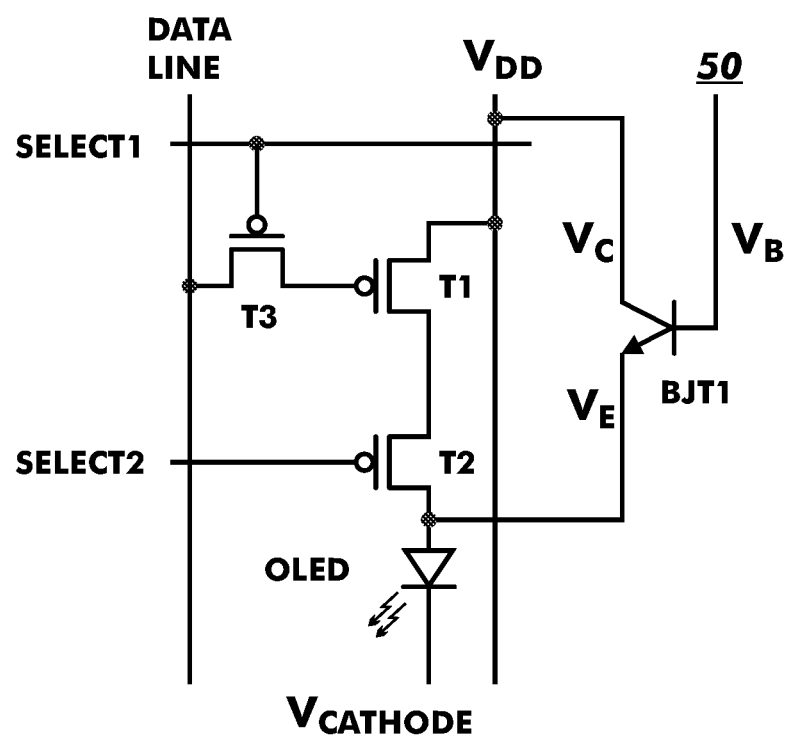
FIG. 8 shows a basic control circuit suitable for an OLED stack with at least three OLED units with a protection circuit with a bipolar junction transistor (BJT).

FIG. 8 shows a protection circuit similar to that shown in FIG. 7. In FIG. 8, the diode D4 of the protection circuit is specifically BJT1, a BJT (bipolar junction transistor), whose collector (C) is connected to $V_{DD}$, whose emitter (E) is connected to a node between T2 and the bottom electrode of the OLED stack and whose base (B) is connected to a power source 50, which is either a voltage source $V_{PROTECT}$ or a current source $I_{PROTECT}$. One benefit of using a BJT in the protection circuit is the current amplification from the base-current to the collector-current. If desired, the collector of the BJT could be connected to a separate power source different from $V_{DD}$. The power source $V_{PROTECT}$ or $I_{PROTECT}$ can be common to all pixels. It should be noted that $V_{PROTECT}$ or $I_{PROTECT}$ may or may not be constant, but may vary depending on whether the OLED is intended to be emitting or not. This can be advantaged when used with a switch transistor to reduce the persistence of the display through shuttering. In FIG. 8A, BJT1 is a "NPN" type of BJT transistor (which is preferred), but could be a "PNP" transistor as well with the appropriate changes in design.

For a NPN type of BJT, whenever the emitter voltage $V_E$ at the bottom electrode of the OLED is greater than the base voltage $V_B$ and $V_B$ is less than the collector voltage $V_C$ ($V_E > V_B < V_C$), the BJT will be in shut-off mode and no current is passed. However, whenever the voltage $V_E$ at the bottom electrode of the OLED is less than the voltage $V_B$ and $V_B$ is less than $V_C$ ($V_E < V_B < V_C$), the BJT will be in forward-active mode. In this mode, the base-emitter junction is forward biased and the base-collector junction is reverse biased and so, the collector-emitter current will be approximately proportional to the base current.

Thus, in FIG. 8A, if $V_C$ of BJT1 is $V_{DD}$ and $V_{PROTECT}$ (which is $V_B$) is set to be less than $V_{th}$ of the OLED, whenever the voltage at the bottom electrode $V_E$ is higher than $V_{th}+V_{CATHODE}$, BJT1 is "off", but whenever $V_E$ falls below $V_{th}+V_{CATHODE}$ (i.e., whenever T1 or T2 is "off"), the voltage at the bottom electrode is maintained near $V_{th}$. Thus, the protection circuit is designed to provide sufficient current whenever needed in order to protect the driving and switch transistors from having voltages across their terminals that exceed their rating whenever the cathode voltage decreases (more negative voltage) below a certain value. Moreover, by setting the base voltage B ($V_{PROTECT}$) below the turn-on voltage of the OLED ($V_{th}$ above $V_{cathode}$), power loss is minimized whenever the voltage delivered to the bottom electrode of the OLED is greater or equal to $V_{th}$.

In some embodiments utilizing the protection circuit shown in FIG. 8, the base voltage ($V_B$) of the BJT is isolated from any external power source. That is, there is no electrical connection between power source $V_{PROTECT}$ or $I_{PROTECT}$ and the base of the BJT. The BJT is physically present with the existing collector and emitter connections as shown in FIG. 8 but the base connection, while still present, is not connected to any external source. In such cases, $V_B$ is not intentionally maintained at any particular value nor is any voltage or current intentionally applied to it. $V_B$ is allowed to "float" independently of the voltages $V_C$ and $V_E$, which remain as part of the active control circuitry that operates the OLED. Nevertheless, there may be parasitic current pathways within the backplane that bias the base internally with high impedance. Note that in this type of embodiment, $V_B$ may vary during the operation of the OLED because of the generation of parasitic currents within the circuitry.

In other embodiments, the $V_B$ of the BJT may be self-biased (sometimes referred to as having a 'Base Bias'). When BJTs are self-biased, there is no externally controlled input signal applied to the base of the BJT but rather, the signal applied to the base of the BJT is set by the value of a constant supply voltage (i.e., $V_{DD}$) and the value of any biasing resistors connected the transistors. One method for achieving self-biasing of the base of the BJT is forming a "fixed base bias circuit". In this arrangement, the base of the BJT is connected to the constant power supply (i.e. $V_{DD}$) with a single current-limiting resistor. This will allow the base current ($I_B$) of the BJT to remain constant for a given value of $V_{DD}$, and therefore the operating point of the BJT to also remain fixed. Alternatively, a simple voltage divider network can provide the required biasing voltage. Note that in this type of embodiment, the biasing voltages and resulting parasitic currents within each pixel will respond to the operation of the OLED. Such a response can provide effective protection for the transistors.

Figure 9:
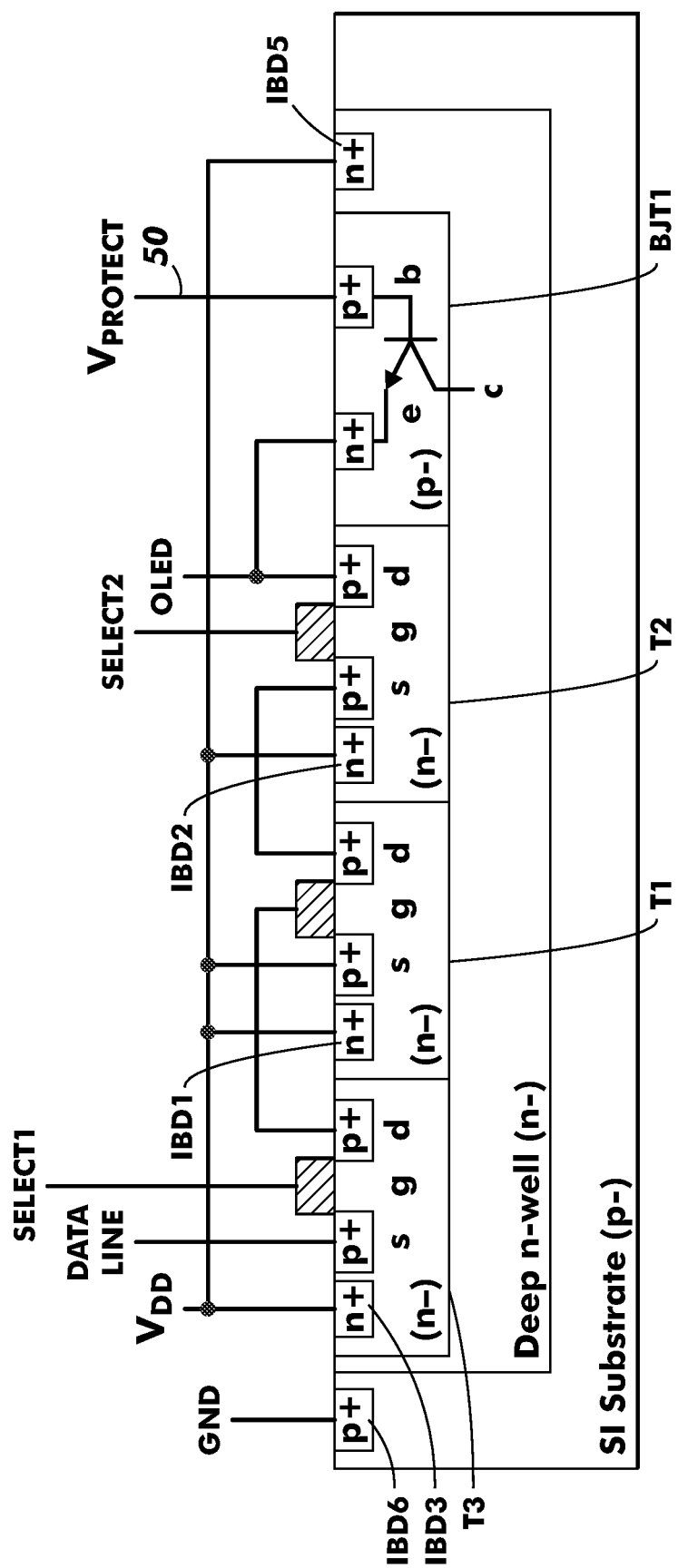
FIG. 9 shows a schematic cross-section through the Si backplane, illustrating the connection location, connections and transistor wells for the circuit shown in FIG. 8.

FIG. 9 is a schematic cross-section representation of the transistor wells for the circuit shown in FIG. 8. Note that T1, T2, T3 may each be located in separate, but not isolated or floating, n-wells that are connected to $V_{DD}$ and all are separated from the p-well of BJT1 (a NPN BJT). For convenience, the source (s), gate (g) and drain (d) regions are marked for T1, T2 and T3. Similarly, the emitter (e), base (b) and collector (c) regions are marked for BJT1. The collector (c) region of BJT1 is shown as being connected to $V_{DD}$ though the deep n-well, but it could alternatively be connected directly to $V_{DD}$ in some embodiments FIG. 9 also indicates IBD5, which is the intrinsic body diode connection to $V_{DD}$ of the deep n-well of the Si substrate in which all of the transistors are located as well as IBD6, which is the intrinsic body diode connection to ground for the entire Si substrate. It should be noted that the BJT in the protection circuit could be either an NPN or PNP transistor. If the BJT is an NPN transistor then the transistor is in a p-well, whereas if the BJT is a PNP transistor, it will be in an n-well.

The use of a protection circuit which comprises a BJT is preferred. When used as part of a control circuit comprising at least two transistors with their channels connected in series, the BJT transistor design is smaller in pixel size. In addition, the inherent amplification factor for a forward-active mode BJT means that a relatively small parasitic current can generate a much larger protection current. Therefore, the current from the reference/protection voltage source is much smaller and the voltage drop on the reference voltage interconnection is dramatically reduced.

The protection circuit may also be designed to prevent other undesirable effects such as short protection, transient spikes, etc. in addition to maintaining a minimum voltage at the bottom electrode below the threshold voltage of the OLED by including other appropriate circuit components. However, in some instances, it may still be useful to include such known types of protection circuitry in the pixel circuit when using the stacked OLEDs of the invention.

For many OLED stacks, especially those comprising three light-emitting units, it is desirable that in the control circuitry that there are no intervening transistors in the electrical connection between the second terminal of the switch transistor and the bottom electrode of the OLED as shown in FIGS. 2-5. By intervening, it is meant that in the electrical connection between the switch transistor and the OLED, the current does not pass directly through another transistor (i.e., one terminal of the transistor is connected to the switch transistor while the other terminal is connected to the OLED so that current would pass through the intervening transistor at some point during the operation of the OLED). There may be other (non-transistor) microelectronic components that are in-line between the switch transistor and the OLED.

There can be a branching (meaning not directly in-line) connection between the switch transistor-OLED connection and a first terminal of a microelectronic component (i.e., a non-intervening transistor or diode) where the OLED operating current does not directly pass-through the non-intervening transistor or diode. For example, this arrangement is illustrated in FIGS. 4-6 where one side of a non-intervening component that is connected to the T2-OLED connection and the other side connected to a power source.

Desirably, the driving transistor is a low-voltage (LV) transistor. That is, it is designed and sized for safe and effective operation at 5V or less without regard or consideration of the actual load in the circuit. This is necessary to help minimize pixel size in order to maximize microdisplay resolution. It should be noted that an OLED stack having three or more OLED units that is driven by the driving transistor will generally require voltages in excess of 7.5V. If needed, two or more serially connected low-voltage driving transistors in separate wells (as shown in FIG. 2c) can be used to further mitigate the effects of higher voltages.

It is desirable that the driving transistor be a p-channel thin-film transistor (also referred to as a p-channel MOSFET (metal-oxide-semiconductor field-effect transistor)). The structure, characteristics and preparation of p-channel transistors are well known. When the driving transistor is a p-channel transistor, its source is electrically connected to an external power source, and its drain is electrically connected to a first terminal of the switch transistor. The gate of the driving electrode is controlled by a data line that is separate from the power source.

It is desirable that the switch transistor is a low voltage transistor when the OLED stack comprises three OLED light-emitting units. That is, it is designed and sized for safe and effective operation at 5V or less without regard or consideration of the actual load in the circuit. The current necessary for operation of the OLED flows through this transistor as well as the driving transistor.

However, if the OLED stack comprises four or more OLED light-emitting units, the operating voltage may be well in excess of 7.5V and the switch transistor can be medium-voltage (for example, designed for 7.5V-12V) or high-voltage (designed for 18-25V) as necessary. Alternatively, two or more serially connected switch transistors, either commonly or independently selected, can be used to mitigate the effects of higher voltages. The serially connected multiple switch transistors may be all LV or a mixture of LV and MV transistors.

It is desirable that the switch transistor be a p-channel transistor. When the switch transistor is a p-channel transistor, its source is connected to the drain of the driving transistor and its drain is electrically connected to the bottom electrode of the OLED. The gate of the switch electrode is controlled by a select line that is separate from the power source and the data and select lines that control the driving transistor.

In some embodiments, it is desirable that both the driving and switch transistors are p-channel transistors where both are low-voltage transistors or the driving transistor is low-voltage and the switch transistor is medium- or high-voltage. In some embodiments, it is also desirable that all transistors in the control circuitry are p-channel transistors.

Although the driving transistor and the switch transistor are electrically connected in series, there may be other intervening microelectronic components between the two transistors. The intervening components may be in-line where the current between the driving and switch transistor passes directly through the in-line component. There may also be other microelectronic components that are electrically connected to the connection between the driving and switch transistors so that the current flowing from the driving transistor also flows to this additional component as well as the switch transistor.

In the most basic form of operation, a voltage is supplied to the driving transistor from an external power source. The select line is set to allow the correct data voltage from the data line to be applied to the gate of the driving transistor allowing the current from the power source to pass through the driving transistor to the switch transistor. The select line for the switch transistor is set to allow the correct charge to be applied to the switch transistor allowing current to pass through the switch transistor to the bottom anode of the OLED stack in each individual pixel. This turns the pixel "on" and it emits light depending on the current received. When the image displayed calls for no or reduced emission from an individual pixel, the data voltage for the drive transistor may be changed to prevent or limit current from flowing through the driving pixel.

Other components in the control circuitry may contribute to the control of the current being supplied by the driving transistor, either the current intended to power the OLED when "on" or current leakage through the driving transistor when the OLED is intended to be "off".

In order to prevent or minimize motion blur by providing a shuttering function, the switch transistor can prevent current flowing to the OLED without regard to the operation of the driving transistor (which controls the power supplied to its pixel); in particular, when the driving transistor is "on" (passing current). At the appropriate time for the pixel, the switch transistor can be selected so that the OLED pixel remains "off" even if the image to be displayed requires that pixel to be "on". This allows for all or rotating sections of pixels in the display to be "off" (non-emitting) which minimizes the perception of motion blur in the microdisplay.

In the microdisplay, the power from the external power source may be delivered to the driving transistor as a variable current or voltage in order to drive the OLED stack to deliver the desired level of luminance. This is often stored during the writing operation by charging a storage capacitor. The power level may be controlled at the external power source or if the power delivered is constant, the power may be set at the appropriate level by other microelectronic circuits within the backplane. This is called "current control" and is typically used to power most OLED devices. Alternatively, the power supplied to the OLED stack can be constant and the total amount of light emission over a set period of time (the frame) is controlled by the time that the OLED pixel is fully "on" compared to the time it is "off". This is called pulse width modulation or PWM control.

Because the control circuit as described is able, without significant leakage or damage, to handle higher voltage and current demands than the designed or rated voltage of at least the driving transistor, the use of OLED stacks with increased amounts of emission (and higher voltages) is enabled. Tandem OLED devices with 2 light-emitting units, which have relatively lower $V_{th}$ requirements, do not emit as much light as OLED stacks with three or more light-emitting units with relatively higher $V_{th}$ requirements. The circuit as described can be used with a stacked light emitting OLED having a threshold voltage ($V_{th}$) of greater than 7.5V; more desirably, the $V_{th}$ of the light emitting OLED stack is at least 10V or greater. Alternatively, the circuit can be used with a stacked OLED that provides a full-color microdisplay with a light emission of at least 2500 nits or preferably at least 5000 nits.

There are two basic approaches to making a pixelated OLED microdisplay where it is necessary to control the brightness of each individual pixel by supplying power to one of the pixel electrodes via control circuitry on a backplane. The first approach involves having each pixel individually produce red, green or blue light (R, G, B respectively) or the same color if it is a monochromatic display. In this case, the light emitting OLED stack can be arranged so that all of the stacked light-emitting units above an individual bottom electrode segment emit the same color of light (selected from R, G or B light) in order to make R, G and B pixels. In some embodiments with this feature, each color pixel forms a microcavity where the distance between the segment bottom electrode and the top electrode depends on the color of light emitted. In this case, the length of the microcavity will depend on the color emitted and will be different for red, green and blue pixels.

The second approach is to have a common multimodal (white) light emitting OLED layer across all pixels with a color filter array (CFA) in order to produce individual RGB pixels. The second approach has an advantage over the first in that it is not necessary to create individual OLED pixels of different formulations and so, manufacturing costs will be reduced.

The number of individual OLED light-emitting units within the stacked OLED is limited only by the overall thickness of the OLED and the ability of the control circuitry to handle the required power to operate the OLED. As the number of OLED units increase, the total amount of light emitted increases, but the thickness of the package, the complexity of the manufacturing process and the threshold voltage all increase as well. An OLED with at least three stacked light-emitting units will provide increased luminance over a tandem (two OLED units) OLED. However, OLEDs with at least four stacked OLED light-emitting units are preferred and more preferably, OLEDs with at least five stacked OLED light-emitting units. An OLED with as many as six to ten or more stacked OLED light-emitting units can be contemplated.

In order to minimize increases in the required voltage to drive an OLED stack, charge generation layers (CGLs; sometimes also referred to as connector or intermediate layers) are located between the individual OLED light-emitting units. This is because the CGLs are structured so that electrons and holes are generated upon voltage application, and injected to the adjacent organic emissive layers. Hence, the use of a CGL can possibly convert one injected electron to multiple photons, allowing for higher luminance. In particular, it is desirable that a CGL is located between each light-emitting unit within the stack. However, it is not necessary for a light-generating unit to have an adjacent CGL on both sides. The OLED light-generating units on the top and bottom of the stack will generally have only one adjacent CGL. There is typically no need to use a CGL between a light-emitting unit and one of the top or bottom electrodes, although a CGL could be used if desired.

Many different kinds of CGLs have been proposed and may be used in the OLED stack. For example, see U.S. Pat. No. 7,728,517 and US 2007/0046189. For the formation of a CGL, an n-p semiconductor heterojunction, which is located at the interface of n-type and p-type layers, is typically needed for the charge generation. Thus, CGLs will have two or more layers. For example, n-doped organic layer/transparent conductive layer, n-doped organic layer/insulating material, n-doped organic material layer/metal oxide layer, and n-doped organic material layer/p-doped organic material layer have all been reported. A desirable metal oxide for CGLs is $MoO_3$. In some instances, the n-layer and p-layer may be separated by a thin intermediate layer. Often, the CGL is arranged so that the n-layer is closer to the anode and the p-layer is closer to the cathode.

One desirable formulation for a CGL has three layers; an electron-transport material doped with a n-dopant (for example, Li), a thin intermediate layer of the same (but undoped) electron-transport material, and a hole-transport material doped with a p-dopant. Suitable electron-transport and hole-transport materials, along with n-dopants and p-dopants suitable for use in a CGLs are well-known and commonly used. The materials may be organic or inorganic. The choice of appropriate materials is not critical and any may be selected based on their performance. The thickness of the CGL should desirably be in the range of 200-450 Å. In many instances, the CGL will have an ETL on the anode side and an HTL on its cathode side to help improve charge transport and help separate the charge-generating dopants (if present) from the LEL in the light-emitting units.

Although the use of CGLs helps to minimize the voltage increase when the OLED light-emitting units are stacked on top of each other, the total voltage required by the stack still increases by approximately the voltage required by each individual unit alone. An OLED with at least three stacked OLED light-emitting units would be expected to require voltages exceeding the recommended operating range of a 5V driving transistor.

Figure 10:
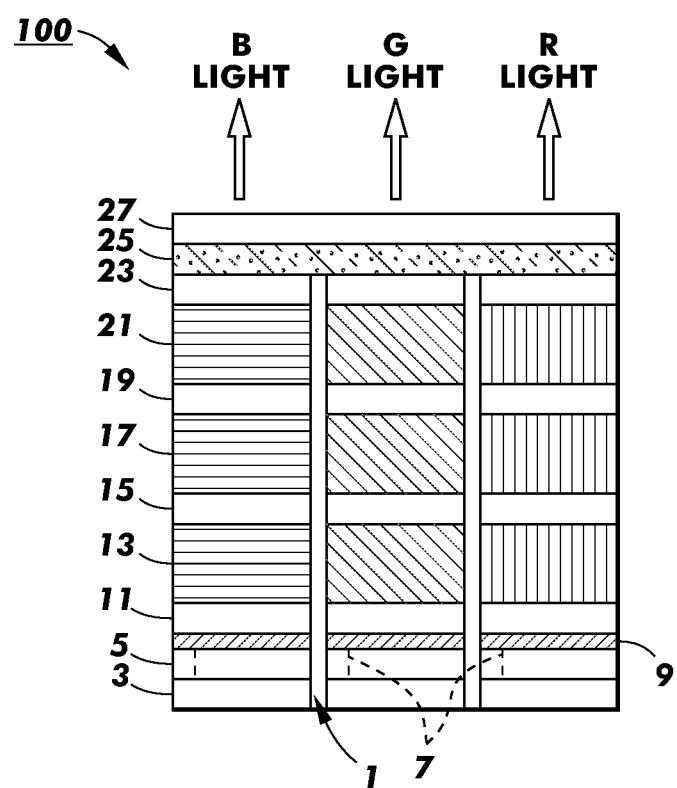
FIG. 10 shows a cross-sectional view of an RGB microdisplay 100 with three adjacent monochromatic RGB OLED stacks, each individual stack having three OLED light-emitting units.

In one embodiment, all of the OLED light-emitting units within the OLED stack above an individual bottom electrode segment emit the same color; for example, red, green or blue. This results in a pixelated RGB microdisplay. FIG. 10 illustrates a microdisplay 100 that uses three different OLED subpixel stacks to create R, G and B pixels. Each OLED subpixel stack contains three OLED light-emitting units that emit the same color in which each unit is vertically separated from another unit by a CGL.

In microdisplay 100, there is a silicon backplane 3 which comprises an array of control circuits such as shown in FIGS. 2-8 as well as other necessary components that will supply power to the subpixels according to an input signal. Over the layer 3 with the transistors and control circuitry, there can be an optional planarization layer 5. Over layer 5 (if present), are individual first electrode segments 9 which are connected by electrical contacts 7, which extend though the optional planarization layer to make electrical contact between the individual bottom electrode segments 9 and the control circuitry in layer 3. The individual bottom electrode segments 9 are electrically isolated from each other laterally by a pixel definition layer 1. Over the segmented bottom electrode segments 9 are non-light-emitting OLED layers 11, such as electron- or hole-injection (EIL or HIL) or electron- or hole-transport (ETL or HTL) layers. A first light-emitting OLED unit 13 is over OLED layers 11. Layer 15 is a charge-generation layer which lies between and separates the first light-emitting layer 13 and a second light-emitting OLED unit 17. Over the second light-emitting OLED unit 17, there is a second charge-generation layer 19 that lies between and separates the second light-emitting OLED unit 17 and a third light-emitting OLED unit 21. Over the third light-emitting layer 21 are nonlight-emitting OLED layers 23, such as electron- or hole-transport layers or electron- or hole-injection layers, and transparent top electrode 25 through which light can be transmitted. The OLED microcavity is protected from the environment by an encapsulation layer 27. In the embodiment shown, all organic layers within a single OLED stack are separated horizontally from the adjacent stack by a pixel definition layer 1 but the top electrode 25 and the encapsulation 27 are in common and extend across the entire active area. However, the top electrode 25 need not be continuous and can be segmented if desired. In microdisplay 100, all of the OLED light-emitting units 13, 17, 21 above the same bottom electrode segment 9 emit the same color of light, either B, G or R. This particular microdisplay is not a microcavity device; however, similar pixelated RGB designs using a microcavity effect can be used.

One well-known method of increasing the luminance and color purity of OLED emission is by taking advantage of the optical microcavity effect. This effect is based on creating an optical resonator between a reflecting surface and a semi-reflective surface which allows some light to pass. Multiple reflections between the two surfaces create standing waves, depending on optical distance between the two surfaces, which will intensify some wavelengths of light and decrease others because of constructive and destructive interference effects that will occur depending on whether the emissions are generated at the anti-nodes or nodes, respectively, of the standing waves. The anti-nodes occur at different locations depending on the total space between the reflectors, and on the wavelength being optimized. However, the light emitted from microcavities can show severe angular dependence, where there can be color shifts and loss of luminance as the angle of viewing deviates from perpendicular to the viewing surface. This is often not a problem for NED applications due to the limited entry-angle of the projection optics.

It would be desirable to further increase the luminance of the OLED stacks by using the microcavity effect. For example, the microdisplay 100 as shown in FIG. 10 could be redesigned to create the microcavity effect by using a reflective bottom electrode or a reflective layer below the bottom electrode, making the top electrode semi-transparent so that it has some degree of reflectivity and adjusting the distance between the uppermost surface of the reflective element (bottom electrode 9 or the underlying reflective layer) and the bottommost surface of the top electrode to create a microcavity suitable for that particular color of light.

Figure 11:
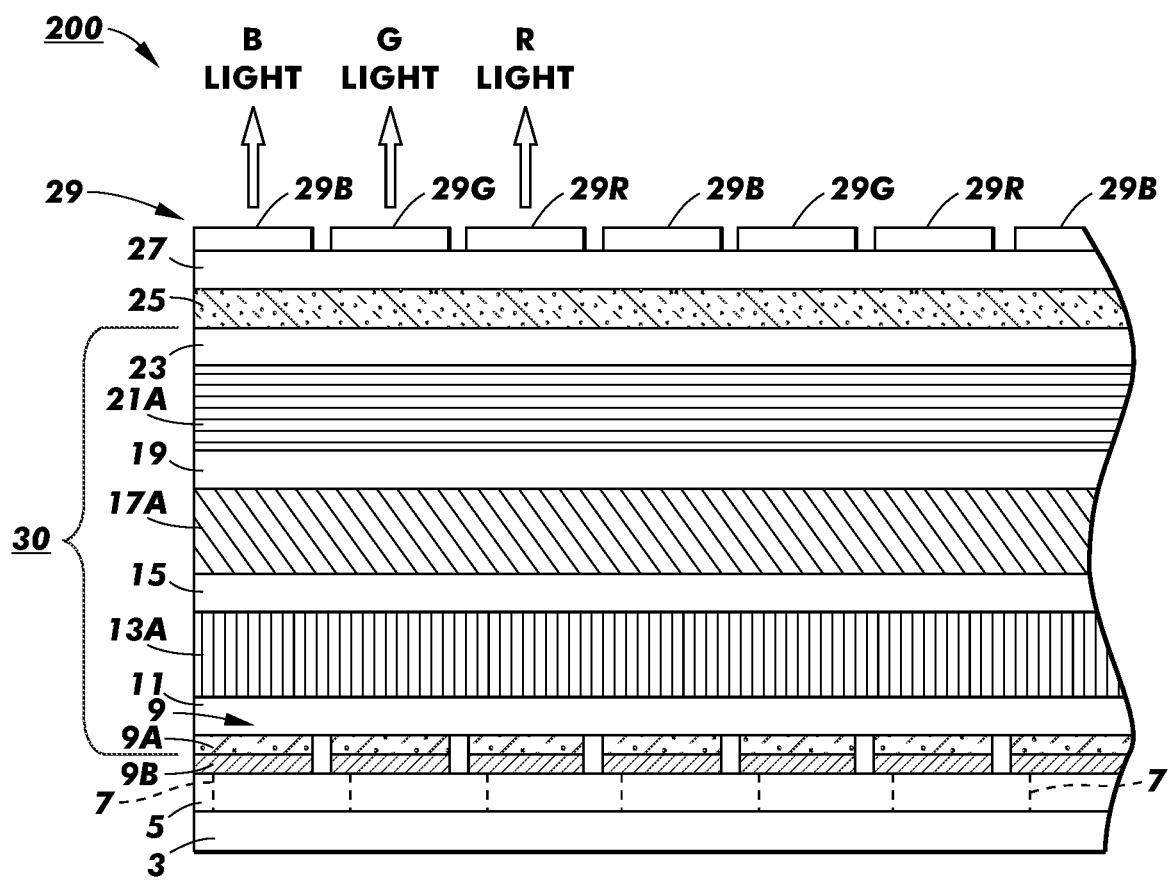
FIG. 11 shows a cross-sectional view of microdisplay 200 with a multimodal microcavity OLED stack with three OLED light-emitting units and an RGB color filter array.

FIG. 11 illustrates a microdisplay 200 that uses a multimodal (white) OLED microcavity that is common across all pixels together with a color filter array (CFA) to create R, G, and B pixels. A multimodal OLED produces more than one color of light. Ideally, a multimodal OLED produces a white light with roughly equal amounts of R, G and B light. Typically, this would correspond to $CIE_x$, $CIE_y$ values of approximately 0.33, 0.33. However, some variation from these values is still acceptable or even desirable depending on the characteristics of the color filters used to create RGB pixels. Microdisplay 200 also incorporates the microcavity effect. In this embodiment, the multimodal OLED stack contains three OLED light-emitting units that emit different colors in which each unit is vertically separated from another unit by a CGL where the distance between a reflective surface and the top electrode is constant over the active area.

In microdisplay 200, there is a silicon backplane 3 which comprises an array of control circuits such as shown in FIGS. 2-8 as well as necessary components that will supply power to the subpixels according to an input signal. Over the layer 3 with the transistors and control circuitry, there can be an optional planarization layer 5. Over layer 5 (if present), are individual first electrode segments 9 which are connected by electrical contacts 7, which extend though optional planarization layer to make electrical contact between the individual bottom electrode segments 9 and the control circuitry in layer 3. In this embodiment, the bottom electrode segments 9 have two layers, a reflective layer 9b which is closer to the substrate 1, and an electrode layer 9a which is closer to the OLED layers. The individual bottom electrode segments 9 are electrically isolated from each other laterally. Over the segmented bottom electrode segments 9 are non-light-emitting OLED layers 11, such as electron- or hole-injection or electron- or hole-transport layers. A red OLED light-generating unit 13A is over OLED layers 11. Layer 15 is a first charge-generation layer which lies between and separates the red OLED light-generating unit 13A and a green OLED light-generating unit 17A. Over the green light-emitting layer 17A, there is a second charge-generation layer 19 that lies between and separates the green OLED light-generating unit 17A and a blue OLED light-generating unit 21A. Over the blue OLED light-generating unit 21A are non-light-emitting OLED layers 23, such as electron- or hole-transport layers or electron- or hole-injection layers, and semi-transparent top electrode 25. This forms an OLED microcavity 30 that extends from the uppermost surface of reflective surface 9B to the bottommost surface of the semi-transparent top electrode 25, which is also a semi-reflective electrode. The OLED microcavity is protected from the environment by an encapsulation layer 27. In this embodiment, there is a color filter array with color filters 29B, 29G and 29R which filter the multimodal emission generated by the OLED microcavity 30 so that B, G and R light is emitted according to the power supplied to the underlaying electrode segment 9.

Figure 12:
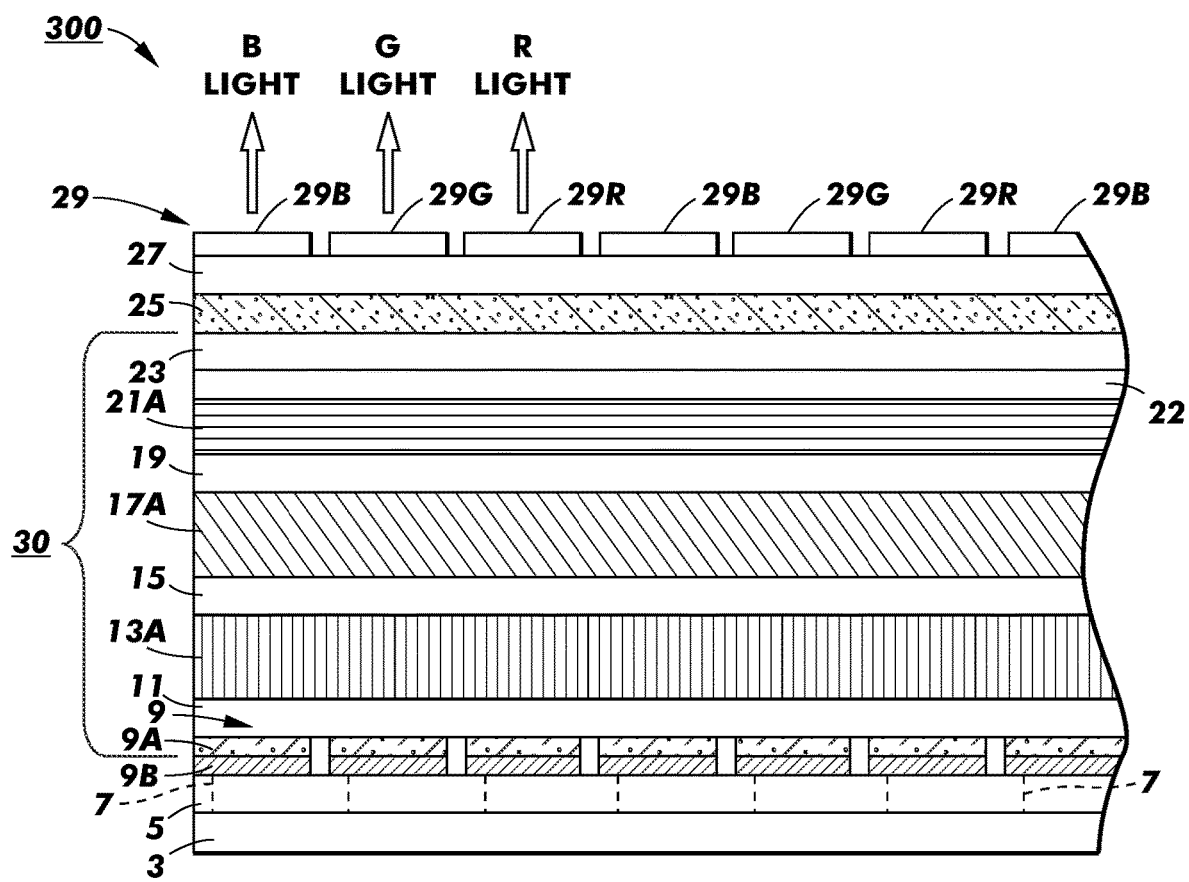
FIG. 12 shows a cross-sectional view of microdisplay 300 with a multimodal microcavity OLED stack with three OLED light-emitting units with an additional blue light-emitting layer and an RGB color filter array.

FIG. 12 shows microdisplay 300, a variation of microdisplay 200, which has an additional blue OLED light emitting layer 22 located between the blue OLED light-emitting unit 21A and the OLED layer(s) 23. In this embodiment, there is no CGL between the blue OLED unit 21A and the additional blue light-emitting layer 22. Like microdisplay 200, microdisplay 300 has three (not four) OLED light-generating units, since blue unit 21A and blue layer 22 are not separated by a CGL (and so, layer 22 is not counted as a separate light-emitting OLED unit and should be considered as part of blue light-emitting unit 21A). Even if blue units 21A and blue LEL 22 were separated by a non-charge generating interlayer, there would still only be three OLED units in the stack. However, if there was an intermediate CGL located between blue emitting unit 21A and the additional blue light-emitting layer 22, then the OLED stack would contain four OLED units.

Figure 13:
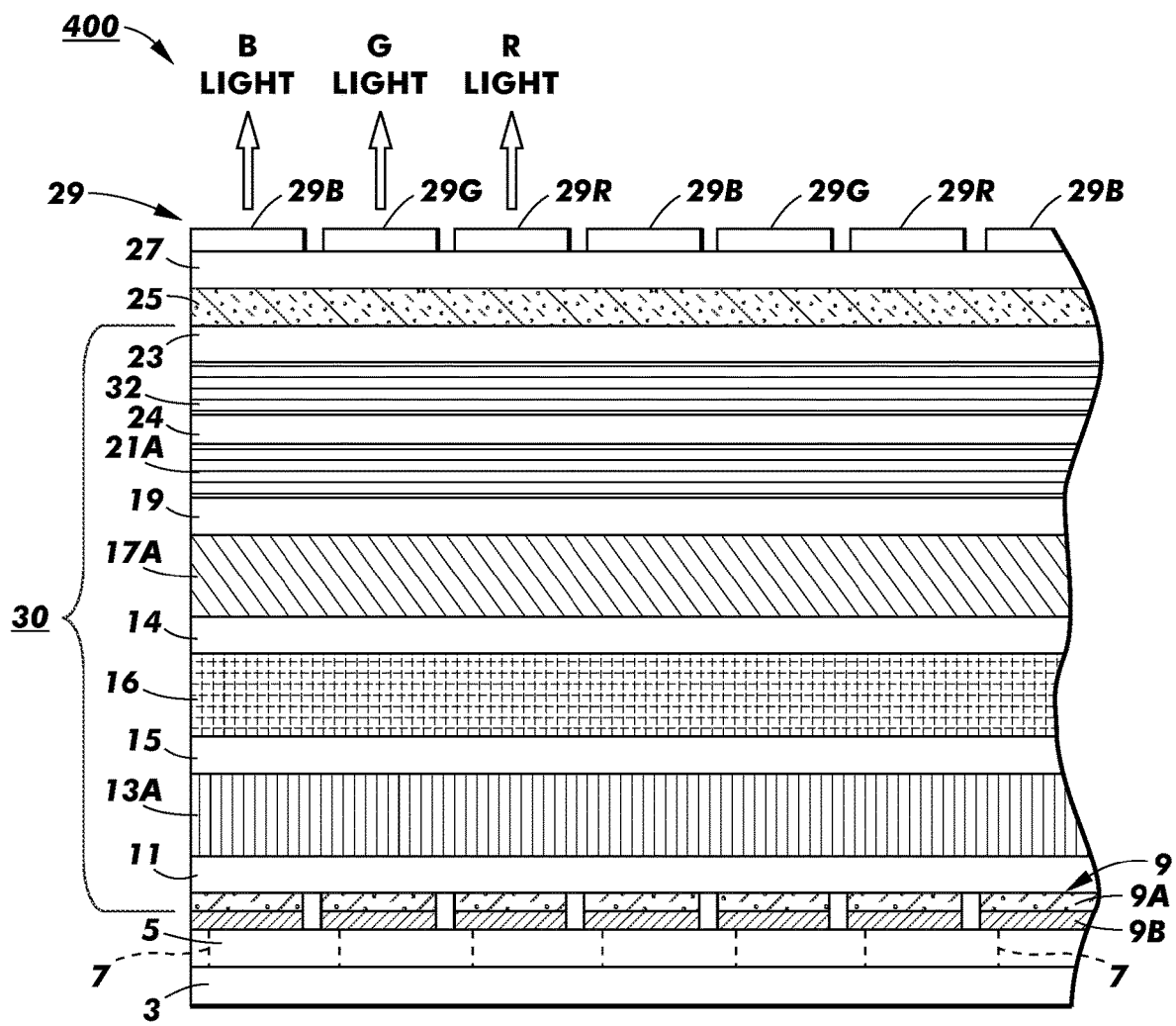
FIG. 13 shows a cross-sectional view of microdisplay 400 with a multimodal microcavity OLED stack with five OLED light-emitting units and an RGB color filter array.

FIG. 13 shows another embodiment of a multimodal OLED microdisplay 200 with microcavity effect similar to microdisplay 200 except that there are five OLED light emitting units. In this case, some of the OLED units emit the same color of light and other units emit a different color of light. In particular, multimodal microdisplay 400 has two blue OLED light-generating units, one green OLED light-generating unit, one yellow OLED light-generating unit and one red OLED light-generating unit, all of which are separated by CGLs.

In microdisplay 400, OLED unit 13A is red emitting. It is separated from yellow light-emitting OLED unit 16 by CGL 15. Yellow light-emitting OLED unit 16 is separated from green light-emitting OLED unit 17A by CGL 14. Green light-emitting OLED unit 17A is separated from a first blue light-emitting OLED unit 21A by CGL 19. A second blue light-emitting unit 32 is separated from the first blue light-emitting OLED unit 21A by CGL 24. All of the other layers are the same as in FIG. 12.

As mentioned previously, the OLED microdisplays are built on a silicon backplane which serves as a substrate. Generally speaking, the backplane will be flat with a uniform thickness. Since silicon backplanes are generally opaque, the OLED stack is preferably top-emitting. However, transparent backplanes are known; in such cases, the OLED stack may be top- or bottom-emitting. The top surface of the substrate is that facing the OLED. The silicon backplane may have various types of subbing layers (i.e., planarization layers, light management layers, light blocking layers, etc.) which may be patterned or un-patterned and can be either on the top or bottom surfaces.

The bottom electrode segments (9 or 9a) can be an anode or a cathode and can be transparent, reflective, opaque or semi-transparent. If the OLED is top-emitting, the bottom electrode can be made of transparent metal oxides or reflective metals such as Al, Au, Ag or Mg or alloys thereof and having a thickness of at least 30 nm, desirably at least 60 nm.

In microcavity applications where the first electrode is over a reflective layer, it should be transparent. However, in other applications, the first electrode layer 9a and 9b can be collapsed into a single reflective electrode so that its uppermost reflective surface forms one side of the optical microcavity (i.e., 30 in FIG. 10).

When the OLED stack is a top-emitting microcavity and the bottom electrode is transparent, there should be a reflecting layer under the bottom electrode that defines a first side of the microcavity 30. When a transparent anode is located over a reflective surface, it is part of the optical cavity. The reflective layer 9b can be a reflective metal such as Al, Au, Ag, Mg, Cu or Rh or alloys thereof, a dielectric mirror or a high-reflection coating. Dielectric mirrors are constructed from multiple thin layers of materials such as magnesium fluoride, calcium fluoride, and various metal oxides, which are deposited onto the substrate. High-reflection coatings are composed from multiple layers of two materials, one with a high index of refraction (such as zinc sulfide (n=2.32) or titanium dioxide (n=2.4)) and one with a low index of refraction (such as magnesium fluoride (n=1.38) or silicon dioxide (n=1.49)). The thicknesses of the layers are generally quarter-wave in terms of wavelength to the light being reflected. It is desirable that the reflective layer reflect at least 80% of the incident light and most preferably, at least 90%. The preferred reflective layer is Al or Ag, with a thickness of 300-2000 Å, most preferably 800-1500 Å.

Desirably, when the OLED stack is bottom-emitting, the bottom electrode is a transparent anode and should transmit as much visible light as possible, preferably having a transmittance of at least 70% or more desirably at least 80%. While the bottom transparent electrode may be made of any conductive materials, metal oxides such as ITO or AZO or thin layers of metals such as Ag are preferable. Poorly conducting materials (e.g., TiN) can be used providing they are made thin.

Electron-transport and hole-transport materials suitable for use in non-emitting layers (i.e., 11 and 23 in FIG. 10) such as hole-injection layers, hole-transport layers or electron-injection layer or electron-transport layers are well-known and commonly used. These layers may be mixtures of such materials and may contain dopants to modify their properties. Since they are non-light emitting, they do not contain emitting materials and are transparent. The choice of appropriate materials is not critical and any may be selected based on their performance.

In embodiments that utilize the microcavity effect, it is typically necessary to select the thickness of various non-light-emitting layers to provide the desired spacing, since the spacing between the various OLED units within the microcavity as well as the size of the microcavity are important to maximize efficiency. Desirably, the adjustment of the spacing between the OLED units as well as the size of the microcavity is provided by using the appropriate thickness of the organic non-emitting layers such as hole transport layers.

Light-emitting layers typically have a host material (or a mixture of host materials), which is the primary component of the layer, and a light-emitting compound. Desirably, the light-emitting compounds are phosphorescent as these have higher efficiency. However, in some instances, some LELs may use fluorescent or TADF (thermally activated delayed fluorescent) compounds as materials for light emission while others use phosphorescent materials. In particular, the blue light-OLED layers may use fluorescent or TADF compounds or combinations thereof while non-blue light-emitting layers may use green, yellow, orange or red phosphorescent compounds or combinations therefor. Light-emitting layers may use combinations of light-emitting materials. The choice of appropriate materials for LELs is well known, is not critical, and any may be selected based on their performance and emission characteristics. When using phosphorescent emitters, it is sometimes necessary to confine the excitons generated by the phosphorescent emitter within the layer. Thus, exciton-blocking layers on either side, or both, of the phosphorescent LEL can be used if necessary. Such materials and their application are well known. In addition, it can be desirable to add HBLs (hole-blocking layers) and EBL layers (electron-blocking layers) around the light-emitting layers, particularly blue light-emitting layers to improve lifetime and luminance efficiency.

The top electrode (i.e., 25 in FIG. 10) should be transparent if the OLED stack is top-emitting, reflective if the OLED stack is bottom-emitting and in the case where the OLED stack is a microcavity, semi-transparent as well as semi-reflective: that is, it reflects part of the light and transmits the rest. In the case of a microcavity, the bottom-most internal surface of the top electrode defines a second side of the microcavity 30. Desirably, the semi-transparent top electrode reflects at least 5%, and more desirably, at least 10% of the light emitted by the LELs in order to establish the microcavity effect. The thickness of the semi-transparent $2^{nd}$ electrode is important since it controls the amount of reflected light and how much is transmitted. However, it cannot be too thin since then it may not be able to efficiently pass charge into the OLED or be subject to pinholes or other defects. A thickness of the upper electrode layer is desirably 100-200 Å, and more desirably 125-175 Å.

The top electrode is desirably a thin layer of metal or metal alloy. Suitable metals include Ag, Mg, Al and Ca or alloys thereof. Of these, Ag is preferred because it has relatively low blue absorption. In order to help with electron transport as well as stabilization, there may an adjacent layer of transparent metal oxide on the electrode surface such as ITO, InZnO or $MoO_3$. Alternatively, metal halides such as LiCl, organometallic oxides such as lithium quinolate, or other organic materials could be used.

There may be protective or spacing layers (not shown in FIGS. 10-13) over the upper electrode to prevent damage during encapsulation.

Over the top electrode 25 and any optional protective layers, if present, is deposited or placed encapsulation 27. At a minimum, the encapsulation should fully cover the light-emitting area on the top and sides and is in direct contact with the substrate. The encapsulation should be impervious to air and water penetration. It may be transparent or opaque. It should not be electrically conductive. It may be formed in-situ or added as a separate pre-formed sheet along with provisions for sealing the side edges. An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired. Alternatively, encapsulation may be provided using a pre-formed sheet or cover slip which is attached over at least the sealing area and enclosed area. The pre-formed sheet may be rigid or flexible. It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air and water proof adhesives such as silicon or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

Although this application describes the use of OLEDs as the light-emissive elements in the microdisplay, the same control circuit can be used in any self-emissive display technology that would require relatively high voltages for light emission. The invention is not limited to only OLEDs but any other display technology that would require greater than 5V, preferably greater than 7.5V, or even greater than 10V to provide light emission of at least 1000 nits or preferably at least 5000 nits.

Crosstalk in displays is where the emitted luminance provided by one pixel is unintentionally affected by another pixel. This is undesirable because the pixel affected no longer provides the exact luminance according to the image signal and so, the quality of the image can be degraded. Depending on the amount and nature of the crosstalk, important factors such as color reproduction, contrast (difference between maximum and minimum luminance), gray-scale, resolution and "ghosting" in displays can all be negatively impacted. In general, cross-talk in microdisplays is particularly problematic where the pixel pitch is small. It is desirable that the amount of cross-talk between pixels be 15% or less, preferable 5% or less, and most preferable 3% or less.

The stacked microcavity OLED devices described within are necessarily thick with defined spacing between the internal light-emitting units. This is necessary to provide the microcavity effect to enhance R, G and B emission within a single microcavity. This can lead to increased cross-talk by both optical and chemical/electrical mechanisms. Some optical processes that can increase the amount of cross-talk include light-scattering and wave-guiding within the OLED device. Some chemical/electrical processes that can increase cross-talk include lateral carrier migration from an active pixel area to a neighboring non-active pixel area within the same layer.

It is believed that there are multiple modes that result in cross-talk. Short-range (0.2-0.7 μm) appear to be a combination of lateral charge carrier and optical mechanisms. Medium-range (3-7 μm) interactions appear to be primarily due to lateral charge carrier migration but can be due partially to optical mechanisms. Long-range (50-200 μm) interactions appear to be primarily due to light-scatter from an active pixel area to a non-active area. It is also believed that there is an even longer-range optical contribution to cross-talk based on wave-guiding according to the pixel pitch.

Some useful methods to minimize the problem of cross-talk due to carrier migration in the OLED device include:

Lateral charge carrier migration reduced by changing layer thicknesses and composition (to increase "sheet resistance") in layers with high carrier mobility (for example; HILs, HTLs, CGLs, ETLs and EILs). In particular, charge carriers (either holes or electrons) are generated within an active area and can move laterally move across the gap between the lit area and the unlit area. This problem appears to occur primarily in layers next to or near one of the electrodes. It is believed that the common HIL and HTL layers over the anode may be the largest contributor to the problem. It appears that once the holes are generated in the lit area of the HIL on one anode pad, they can migrate to the unlit area of a neighboring anode pad and the resulting voltage due to the holes can exceed the $V_{th}$ of the OLED and so the (nominally unlit) pixel emits light anyway. In addition, the holes can enter the conductive anode pad as electrons and flow laterally through the anode with very little lateral resistance. At the far side of the unlit anode pad, the current can pass back into the HIL (as holes) for the jump to the next unlit anode pad. Thus, the problem of carrier migration may not just be limited to a shorter distance between adjacent anode pads, but could have a longer distance component as well. For this reason, careful attention should be paid to the thickness and composition of both electrodes and in particular, the anode. Thinner organic layers with less carrier mobility can help to minimize these undesirable carrier migration processes.

Material choice for the organic layers with high carrier mobility. In particular, materials may be selected to minimize their contribution to cross-talk. The type and level of p-dopant (for example, F4-TCNQ, F6-TCNNQ or HAT-CN) added to the HIL may be important in this regard as well as the choice of HTM (for example, aromatic amine compounds such as NPB or spiro-TTB) in the HIL or HTL. P-dopant only or non-doped HIL may also be effective. In some cases, a non-doped HIL and a p-doped HTL can be used.

Inorganic HIL materials such as $MoO_3$ (which may be mixed with organic materials) may also have advantages.

Some useful methods to minimize the problem of cross-talk due to optical processes within the OLED device include:

Optimized color filters to reduce light wave guiding between the air/glass interface and the reflective anode, including the use of optical filtering layers specifically designed to absorb light traveling at high angles from the substrate normal direction.

Light-scattering reduced by reduction in scattering sites. In particular, the amount of small particle debris on or near the anode should be minimized. Scattering can also occur from roughness in the cathode which can depend on the composition and process used for deposition. (for example, see Shen et al, "Efficient Upper-Excited State Fluorescence in an Organic Hyperbolic Metamaterial", Nano Lett. 2018, 18, 3, 1693-1698)

The overall anode surface should be as flat and smooth as possible over both the active pixel areas and between the pixels. In particular, it is known that protrusions, humps or other structures that form a PDL (pixel defining layer) between the pixels and extend above the surface of the anode within the pixel area, can be useful for scattering light back into the pixel area and prevent it from entering a neighboring (unlit) pixel. However, this approach is not as effective when thicker OLED layers that overlay the structures are present. Light trapped within the thicker layer is more likely to be internally reflected within the layer so that it can travel over the structure to the other side. If the anode and overlaying OLED layers are uniformly flat, light that is wave guiding within the layers of the display is more likely to continue uninterrupted until it is absorbed or reaches the edge of the display.

The use of absorbers for wave-guided light.

Light absorption by the dielectric of the backplane.

Design of the HIL and anode to create a barrier for charges from the HIL to enter the anode.

In order to control cross-talk, it may be useful to add an additional separate pixel control circuit to a node located between the second switch transistor and the anode of the OLED that controls the voltage at the anode whenever the OLED is driven so that is nominally "off" (not powered and so, no emission). In particular, the pixel control circuit should reduce the voltage below the $V_{th}$ of the OLED only when the driving circuitry calls for that pixel to have no or very little emission. In this way, any voltage formed by lateral carrier migration can be minimized.

Experimental Results

In the following examples, the numbers before each material (e.g., 200 HIL) are physical layer thicknesses in Angstroms unless otherwise noted. All % are by weight. All devices were encapsulated after deposition of the cathode using the same procedures. All materials were purchased commercially.

The backplane used for the following experimental devices was a single crystal silicon-based backplane and was used as received with the schematic control circuitry shown in FIGS. 6a and 6b. The backplane contains a driving transistor (T1) and a switch transistor (T2), which are serially connected low-voltage (rated at 5V) p-channel transistors, and a protection circuit with a NPN type bipolar junction transistor (BJT1) for each pixel. In all of the experimental examples, the base of BJT1 was isolated; that is the base was not connected to an external power source so that the base voltage of the BJT was not intentionally controlled or set to any particular voltage. The backplane included a reflective metal layer as the bottom electrode/anode.

A comparative 2-unit stacked OLED device A-1 was prepared as follows:

Layer 1 (Reflective Bottom Electrode/Anode): as supplied

Layer 2 (Hole Injection Layer HIL): 200 Hole-Transporting Material HTM1+6% p-dopant PD1

Layer 3 (Hole Transporting Layer HTL1): 410 Hole-Transporting Material HTM1

Layer 4 (HTL2): 50 Hole-Transporting Material HTM2

Layer 5 (Green LEL): 100 Green Host GH1 and 3% green phosphorescent dopant GPD1

Layer 6 (Yellow LEL): 100 GH1+10% GPD1+3% red phosphorescent dopant RPD1

Layer 7 (Electron Transporting Layer ETL1): 200 Electron-Transporting Material ETM1

Layers 8-10 (Charge Generation Layer CGL1): 270 trilayer

Layer 11A (HTL3): 300 HTM1

Layer 11B (HTL4): 280 HTM1

Layer 12 (Blue LEL2): 200 Blue Host BH1+4% Fluorescent blue dopant BFD1

Layer 13 (ETL2): 150 ETM2

Layer 14 (Electron Injection Layer EIL): 150 ETM1+2% Li

Layer 15 (Semi-transparent Cathode): 105 75% Ag/25% Mg

A second comparative OLED device A-2 was prepared in a similar manner except that the thickness of Layers 11A and 11B were increased to 1090 and 4090 respectively. Both A1 and A-2 are two-unit stacked OLEDs where Layers 5 (G LEL) and Layer 6 (red LEL) together represent one unit (a G-Y stack) and Layer 11 (Blue LEL) represent a second unit (a B stack) which is separated from the first unit by a CGL. Layers 5 and 6 are a single unit because they are adjacent LELs which are not separated from each other by a CGL (layers 8 and 9). Both A-1 and A-2 are microcavity devices where the microcavity thickness for A-1 is 2320 A and in A-2, the microcavity is 6920 Å. These two-unit stacked OLED devices represent the current state-of-the-art.

An inventive 3-unit stacked OLED B-1 was prepared as in the same manner as A-1 except that the following additional layers were inserted between Layers 11A (whose thickness was adjusted to 470) and 11B (at 4090):

Layer 16 (BLEL1): 200 BH1+4% BFD1

Layer 17 (ETL3): 150 ETM2

Layers 18-20 (CGL2): 270 trilayer (same formulation as CGL1)

Figure 14:
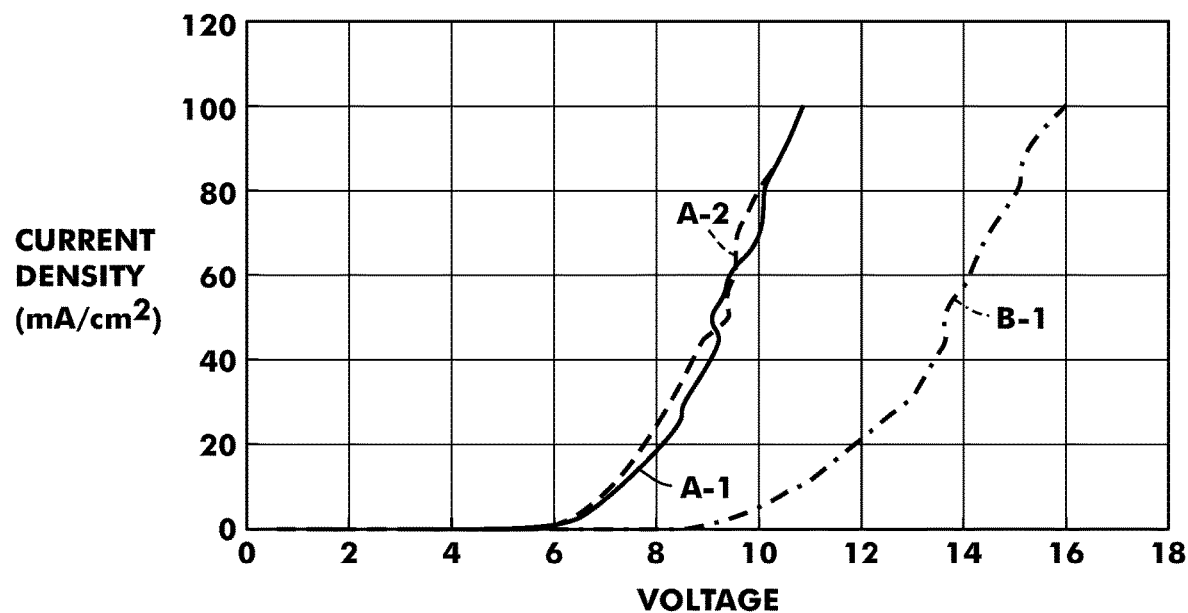
FIG. 14 shows a plot of Current Density vs Voltage for some comparative and inventive OLED devices.

OLED device B-1 is a 3-unit stacked OLED where Layers 5 and 6 are the first G-Y unit (same as in A-1), Layer 16 is an added second B unit and Layer 12 (as in A-1) is a third B unit. The second unit (layer 16) is separated from the first unit (layers 5 and 6) and third unit (Layer 12) by a CGL. That is, B-1 contains an extra B unit compared to A-1 and so, will have higher luminance but with increased voltage requirements. OLED B-1 is a microcavity device with the same microcavity thickness (6920 A) as device A-2. FIG. 14 shows the characteristic I-V curves (current density in mA/cm² vs voltage) for OLEDs A-1, A-2 (comparative 2-unit devices) and B-1 (inventive 3-unit devices) which are also tabulated in Table 1.

TABLE 1

Tabulated I-V Data for OLEDs

| Device | I* | V* | L* |
|---|---|---|---|
| A-1 | threshold | 5.5 | |
| | 1 | 6.0 | 30.4 |
| | 5 | 6.7 | 40.0 |
| | 10 | 7.1 | 41.5 |
| | 100 | 10.8 | 35.5 |
| A-2 | threshold | 5.3 | |
| | 1 | 6.3 | 29.0 |
| | 5 | 7.3 | 30.3 |
| | 10 | 8.0 | 30.3 |
| | 100 | 13.5 | 24.5 |
| B-1 | threshold | 7.6 | |
| | 1 | 9.0 | 28.5 |
| | 5 | 9.9 | 32.8 |
| | 10 | 10.7 | 33.7 |
| | 100 | 16.0 | 28.6 |

*I = Current density on the anode pads in mA/cm²
*V = voltage
*L = Luminance efficiency in cd/A In FIG. 14 and Table 1, OLEDs A-1 and A-2 have about the same $V_{th}$. However, OLED B-1, with an extra B unit, has a significantly higher $V_{th}$ and requires an even higher voltage (about 2.5V higher) to produce the same current density as A-2.

Figure 15:
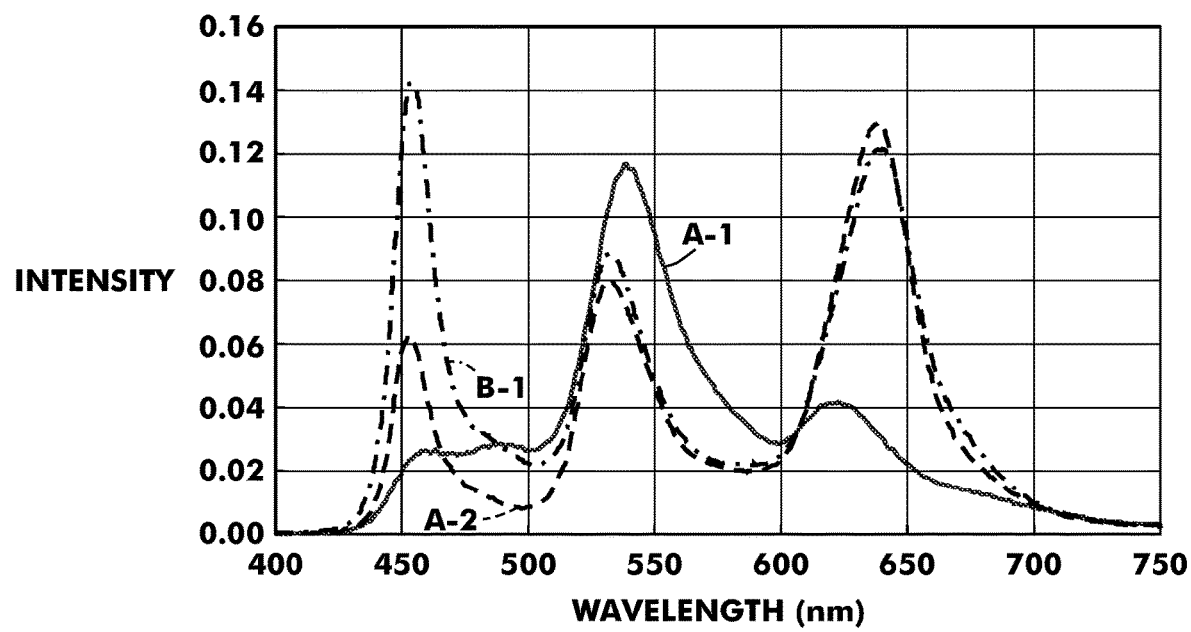
FIG. 15 shows the spectra (plotted as Intensity vs Wavelength) for some comparative and inventive OLED devices.

The advantages of having a microcavity 3-unit stacked OLED over 2-unit stacked OLED can be seen in FIG. 15, which compares (intensity vs wavelength in nm) the spectral output without color filters of A-1, A-2 and B-1. OLED A-1, which has a thinner microcavity, has relatively less B and R emission compared to G emission. OLED A-2, with a microcavity appropriate for all 3 colors, has more B and R emission compared to G, but is still limited for B emission. OLED B-2, with the additional B unit, has greatly increased blue emission compared to A-2.

The results above refer to the white-light OLED devices prior to the addition of color filters that will create the R, G and B pixels for a microdisplay. As commonly known in the art, without regard to any inherent imbalance to the relative amounts of R, G and B light produced by the W OLED, a desired R, G and B balance (usually referred in terms of white luminance such as a D65 white point) in the display can be achieved by driving the individual color pixels to the appropriate luminance for that color. For example, if a W OLED produces insufficient blue light and excess red light compared to green light, the B pixel can be driven at higher voltages to generate more blue light, while the R pixel can be driven at lower voltages so that less red light is generated.

Figure 16:
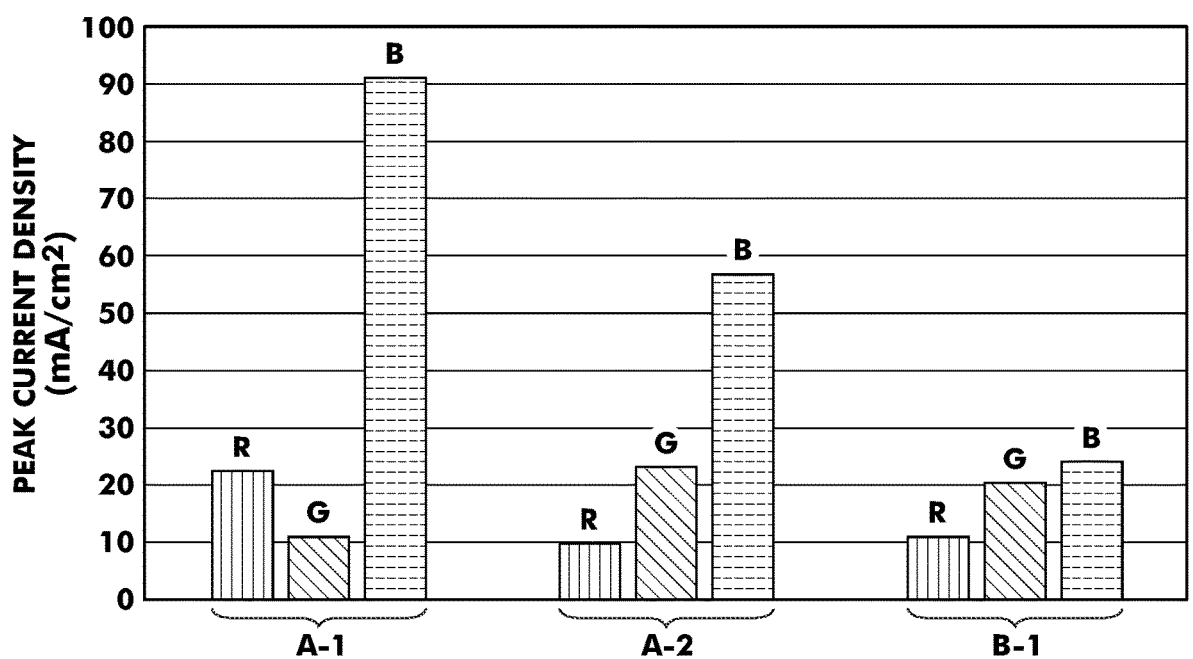
FIG. 16 shows a graph of the peak current densities necessary for each color for comparative and inventive OLED devices with color filters in order to produce a D65 white point.

FIG. 16 shows a plot of the peak current densities necessary for each color for OLED devices A-1, A-2 and B-1 using color filters to produce a D65 white point, assuming equal areas for the R, G, and B subpixels. The current densities in the B required by the 2-unit devices (A-1 and A-2) are much greater than the 3-unit device B-1. The current densities in the R and G are about the same in all 3 devices. The 3-unit device B-1 requires less current density and hence, less power to achieve the same target luminance at the same white point.

The lifetime of a display is determined by the rate of efficiency drop of an OLED with continued operation which is primarily a function primarily of the current density and temperature. Therefore, the display B-1 will have a lifetime that is more than 2× that of A-1 or A-2.

In microdisplays, which need produce relatively high luminance given their smaller size, it is desirable to have the total current (and current densities) to be about the same (or as close as possible) for each color while displaying white at the maximum display luminance. This will result in a number of advantages in terms of: neutral fade (where each color of subpixel degrades in luminance efficiency at about the same rate over the device lifetime), high luminance (each pixel will be driven at its maximum brightness leading to increased efficiency), high contrast (the full dynamic range of each pixel is available) and increased lifetime (the current load is shared equally by each color of pixel).

However, the advantages of using OLEDs with 3 or more units to provide increased luminance can be offset if there is an increase in the voltage required. In a display, the power to each pixel is supplied and controlled by the control circuits in the backplane. However, in a microdisplay which requires a high number of pixels in a reduced area, there is only limited physical space for the transistors and other circuit components. Generally speaking, higher voltage and current requirements must be handled by larger, thicker or more robust electronic circuitry. Currently, the size of OLED microdisplays dictates that the electronic circuitry be rated to handle 5V or less in order to achieve the desired pixel size and density (pixel pitch).

Electronic circuitry such as transistors can fail catastrophically if the power supplied to the gate of the transistor is excessive for too long. However, not all levels or time of over-voltage will cause the transistors to permanently fail; in many cases, the transistors will fail via leakage. Increased leakage is a common failure mode resulting from non-catastrophic overstress of a semiconductor device, when the junction or the gate oxide suffers permanent damage not sufficient to cause a catastrophic failure. Overstressing the gate can lead to stress-induced leakage current.

Solving motion blur in microdisplays used in virtual reality and similar products requires that the OLED provide very high luminance over a very short period of time and then, be turned off for another period of time (the total period of on/off being less than human perceptible range to avoid flicker). This means that the control circuitry in the backplane must supply a high voltage/current to generate high luminance at one period and then shut off power to the OLED for another period. If the power applied to the transistors in the control circuitry is too high in the period when the OLED is turned on, then the current can leak through the transistor when it should be "off" and the OLED does not fully turn off. The difference between the OLED luminance at the time when it turned "on" and the luminance at the time when is supposed to be turned "off" is generally referred to "contrast". High contrast is desirable for microdisplays since it makes the image appear sharp and crisp; low contrast makes the image appear dull and flat.

Figure 17:
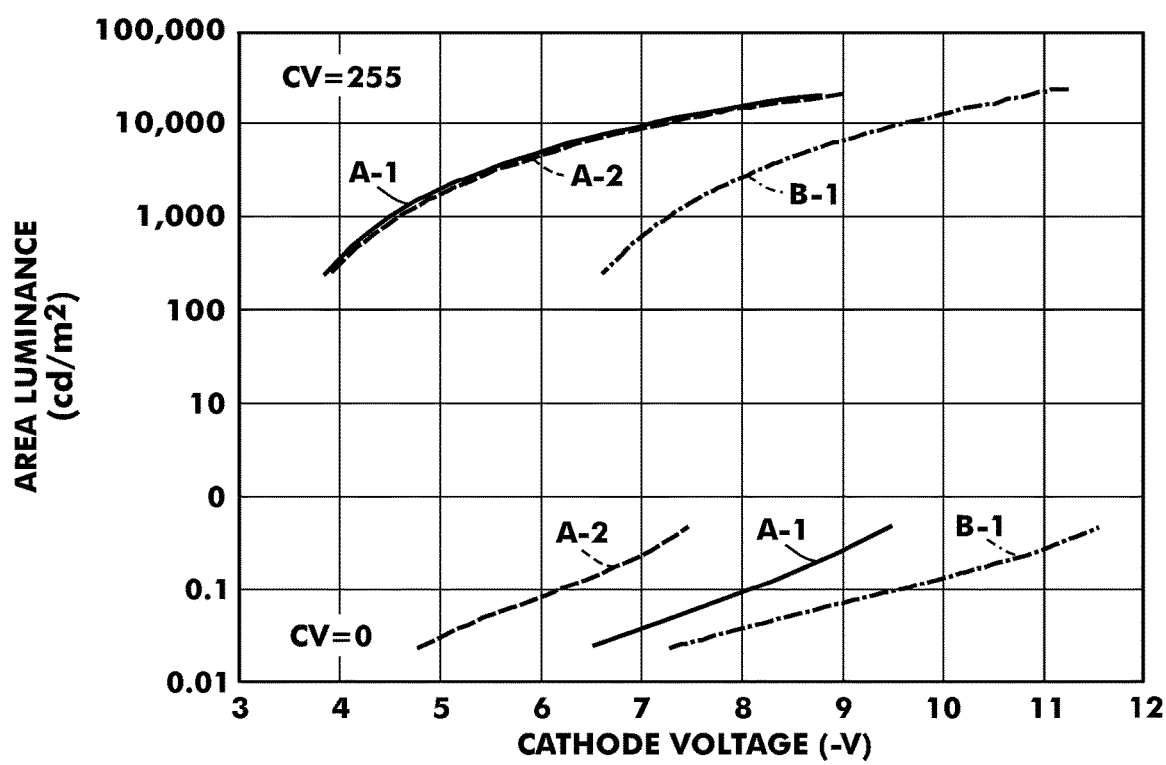
FIG. 17 shows a plot of Luminance vs Voltage for comparative and inventive OLED devices when the devices are driven to produce black and again at peak white luminance.

FIG. 17 shows sets of (luminance vs cathode voltage) curves for 2 unit comparative devices and an inventive 3 unit device. The upper set of curves are when the devices are driven at full luminance (white=CV255) and the drive transistor is "on". The lower set of curves are when the devices are driven at no luminance (black=CV0) and the drive transistor is nominally "off". However, leakage of current through the drive transistor cause some small amount of luminance to be generated and the voltage at the cathode is non-zero. The difference between the two sets of curves represent the "contrast" of the device and is desirably as high as possible by minimizing the luminance caused by current leakage through the drive transistor. As can be seen from FIG. 17, the contrast of all three devices is about the same (slightly less than $10^5$) and relatively constant over a range of cathode voltages.

Note that the inventive 3 unit device maintains about the same overall contrast as the comparative 2 unit devices despite requiring higher operating voltages that exceed the design limits of the drive transistor. Although less current density is needed to achieve the full white for B-1 than A-1 or A-2 as shown in FIG. 16, B-1 still requires more voltage (about 2.5V, see FIG. 14). There is no evidence of increased leakage with the higher voltage OLED with the backplane used in this invention. Moreover, there is no evidence in B-1 of any catastrophic transistor failure due to the higher voltage requirements (see Table 1) nor does device lifetime in terms of the control circuitry seem to be affected. These results are unexpected since the transistors in the backplane for A-1, A-2 and B-1 were designed with transistors suitable for driving a 1- or 2-unit OLED where low-voltage transistors are acceptable and commonly used.

Using the same low-voltage backplane as A-1, A-2 and B-1, another inventive 3-unit OLED device B-2 was prepared as follows:
Layer 1 (Bottom Electrode/Anode):
Layer 2 (HIL): 200 HTM1+6% PD1
Layer 3 (HTL1): 410 HTM1
Layer 4 (HTL2): 50 HTM2
Layer 5 (Green LEL): 100 GH1 and 3% GPD1
Layer 6 (Yellow LEL): 100 GH1+10% GPD1+3% RPD1
Layer 7 (ETL1): 200 ETM1
Layers 8-10 (CGL1): 270 tri-layer
Layer 11 (HTL3): 570 HTM1
Layer 12 (Blue LEL2): 250 BH1+4% BFD1
Layer 13 (ETL2): 150 ETM2
Layers 14-16 (CGL2): 270 tri-layer (same formulation as CGL1)
Layer 17 (HTL4): 3840 HTM1
Layer 18 (BLEL1): 250 BH1+4% BFD1
Layer 19 (ETL3): 150 ETM2
Layer 20 (EIL): 100 ETM2+2% Li
Layer 21 (Semi-transparent cathode): 105 75% Ag/25% Mg OLED B-2 is a 3-unit device like B-1 because it contains a G-Y unit (layers 5 and 6) separated from a second blue unit (layer 12) by a CGL (layers 8-10) which in turn is separated from a first blue unit (layer 18) by a second CGL (layers 14-16) in the order of (from the backplane) of Y-G/B/B. Like B-1, B-2 is a microcavity white light-generating OLED with a microcavity of 6910 Å.

In a similar manner, an inventive 4-unit OLED device C-1 was prepared as follows:
Layers 1-11: Same as in layers 1-11 in B-2
Layer 12 (Blue LEL2): 200 BH1+4% BFD1 (decrease of 50 Å)
Layer 13 (ETL2): 100 ETM2 (decrease of 50 Å)
Layers 14-16: Same as layers 14-16 in B-2
Layer 17 (HTL4): 420 HTM1 (decrease of 3420 Å)
Layer 18 (BLEL1): 200 BH1+4% BFD1 (decrease of 50 Å)
Layer 19 (ETL3): 100 ETM2 (decrease of 50 Å)
Layers 20-22 (CGL3): 270 tri-layer (same formulation as CGL1 and CGL2)
Layer 23 (HTL5): 2620 HTM1
Layer 24 (HTL6): 50 HTM2
Layer 25 (Yellow LEL): 200 GH1+10% GPD1+3% RPD1
Layer 26 (ETL4): 480 ETM1
Layers 27-28: Same as Layers 20-21 in B-2

OLED C-1 is a 4-unit device because it contains an additional Y unit (layer 25) along with the same G-Y and two B units in B-2 in the order of (from the backplane) of Y-G/B/B/Y. In C-1, the additional Y unit is separated from the first B unit (layer 18) by CGL3 (layers 20-22). C-1 is a microcavity white light-generating OLED with a microcavity of 6910 Å.

In a similar manner, an inventive 5-unit OLED device D-1 was prepared as follows:
Layers 1-10: Same as in layers 1-11 in C-1
Layer 11 (HTL3): 370 HTM1 (decrease by 200 Å)
Layers 12-16: Same as layers 12-17 in C-1
Layer 18 (ETL2): 100 ETM2 (decrease of 50 Å)
Layers 14-16: Same as layers 14-16 in C-1
Layer 17 (HTL4): 620 HTM1 (increase of 200 Å)
Layers 18-22: Same as in layers 18-22 in C-1
Layer 23 (HTL5): 610 HTM1 (decrease of 2010 Å)
Layer 24 (BLEL3): 200 BH1+4% BFD1
Layer 25 (ETL3): 100 ETM2
Layers 26-28 (CGL4): 270 tri-layer (same formulation as CGL1, CGL2 and CGL3)
Layer 29 (HTL6): 1440 HTM1
Layers 30-34: same as layers 24-28 in C-1

OLED D-1 is a 5-unit device because it contains an additional B unit (layer 24) along with the same Y, G-Y and two B units in C-1. It has a total of 3 B units, one Y unit and one G-Y unit, all separated by a CGL in the order of (from the backplane) Y-G/B/B/B/Y. C-1 is a microcavity white light-generating OLED with a microcavity of 6910 Å.

Figure 18:
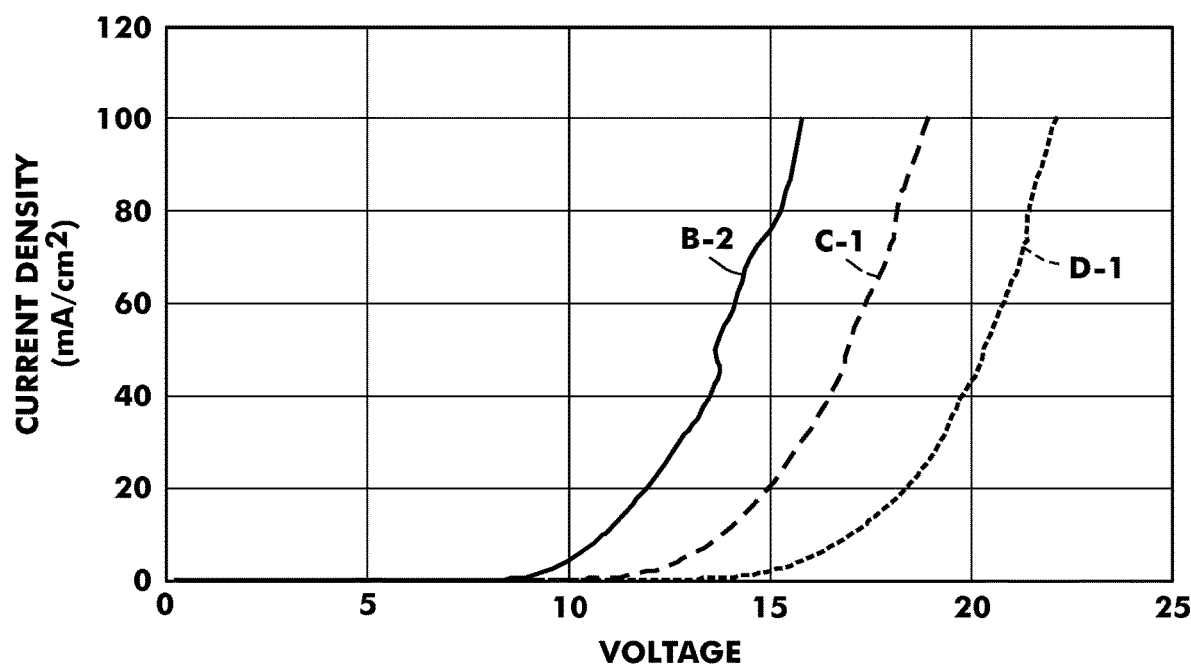
FIG. 18 shows a plot of Current Density vs Voltage for some inventive OLED devices.

FIG. 18 shows the characteristic I-V curves for OLEDs B-2, C-1 and D-1 which are also tabulated in Table 2.

TABLE 2

Tabulated I-V Data for OLEDs

| Device | I* | V* | L* |
|---|---|---|---|
| B-2 | threshold | 8.2 | — |
|  | 1 | 9.1 | 30.9 |
|  | 5 | 10.2 | 35.4 |
|  | 10 | 10.9 | 35.8 |
|  | 100 | 15.8 | 30.2 |
| C-1 | threshold | 10.5 | — |
|  | 1 | 11.7 | 52.6 |
|  | 5 | 13.0 | 53.6 |
|  | 10 | 13.9 | 52.7 |
|  | 100 | 19.0 | 42.2 |
| D-1 | threshold | 12.8 | — |
|  | 1 | 14.5 | 50.5 |
|  | 5 | 16.0 | 51.9 |
|  | 10 | 17.1 | 51.6 |
|  | 100 | 22.1 | 42.1 |

*I = current in mA/cm$^2$
*V = voltage
*L = Luminance in cd/A

As shown by FIG. 18 and Table 2, the addition of each unit within the OLED provides greater luminance but also increases the $V_{th}$ and operating voltage by about 2.5V.

Figure 19:
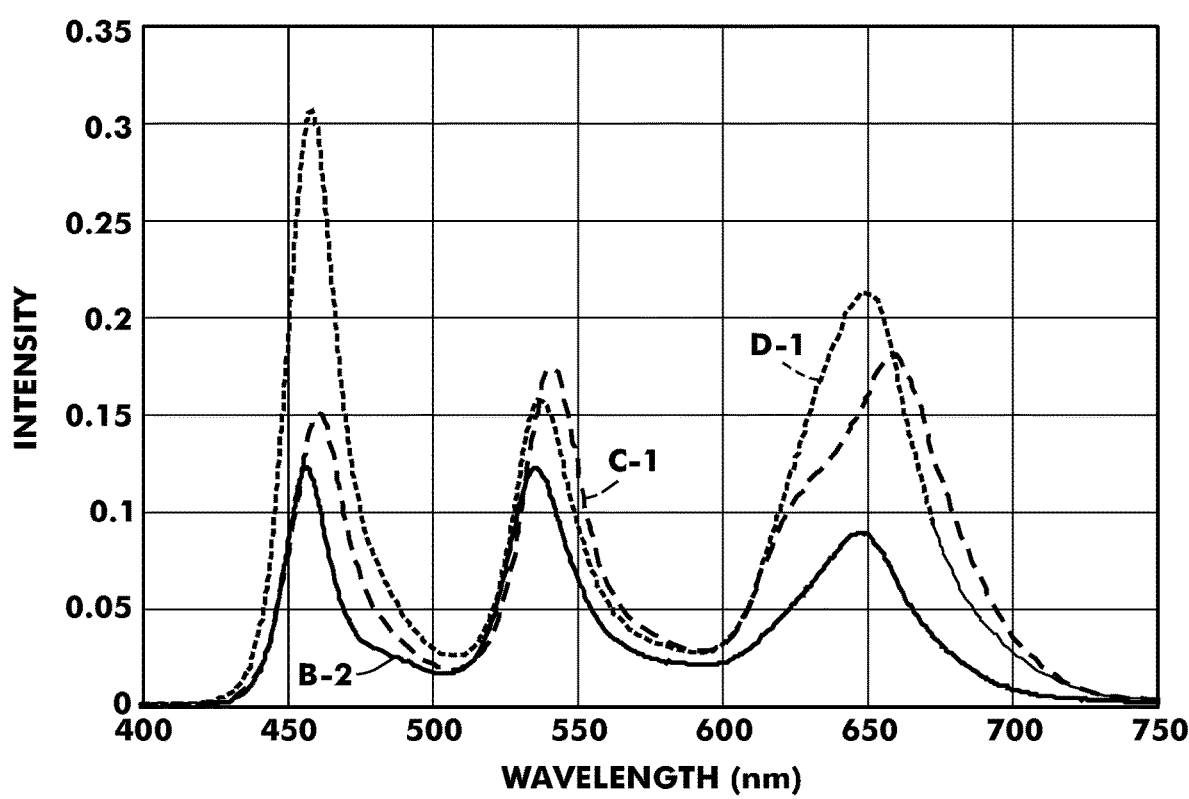
FIG. 19 shows the spectra (plotted as Intensity vs Wavelength) for some inventive OLED devices.

The advantages of adding additional units to a microcavity 3-unit OLED can be seen in FIG. 19, which compares the spectral output (without color filters) of B-2 (3-unit), C-1 (4-unit) and D-1 (5-unit). OLED B-2 has a G/Y unit plus 2 B units. Adding another Y unit as in C-1 increases the amount of G and R emission relative to B-2 but not much in the way of B emission. Adding a third B unit as in D-1 further increases the blue emission with retaining the higher G and R emission.

Figure 20:
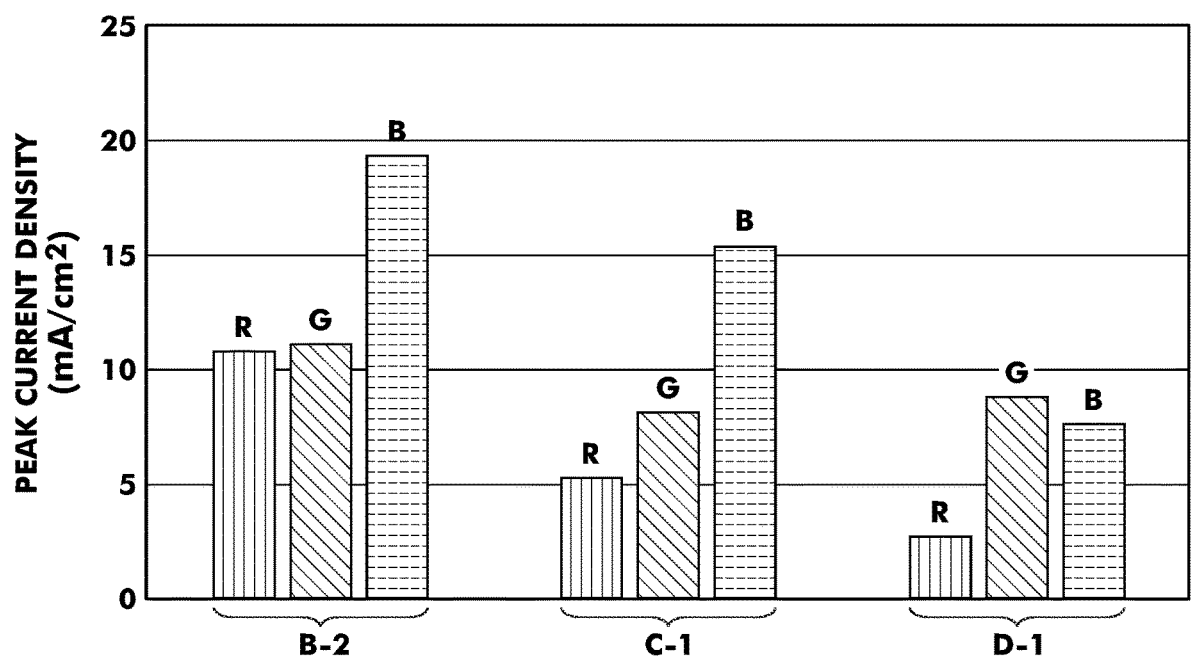
FIG. 20 shows a graph of the peak current densities necessary for each color for some inventive OLED devices with color filters in order to produce a D65 white point.

Similar to the results shown in FIG. 16, FIG. 20 shows the relative amounts of peak current density for each color pixel necessary to create a balanced white luminance (using a color filter) at 1500 cd/m² with OLEDs B-2, C-1 and D-1. The addition of an extra Y unit in C-1 decreases the current needed to produce the necessary amounts of R and G luminance compared to B-2. The addition of an extra B unit in D-1 further decreases the voltage needed to produce the necessary amount of B light compared to C-1. Because these OLEDs with 3 or more units require less current density to achieve the same luminance, their operational lifetime will be significantly greater than OLEDs with fewer units. The LT70 (time for emission output to degrade by 70%) lifetime for these devices are predicted to be at least 18,000 hours for average video content.

Figure 21:
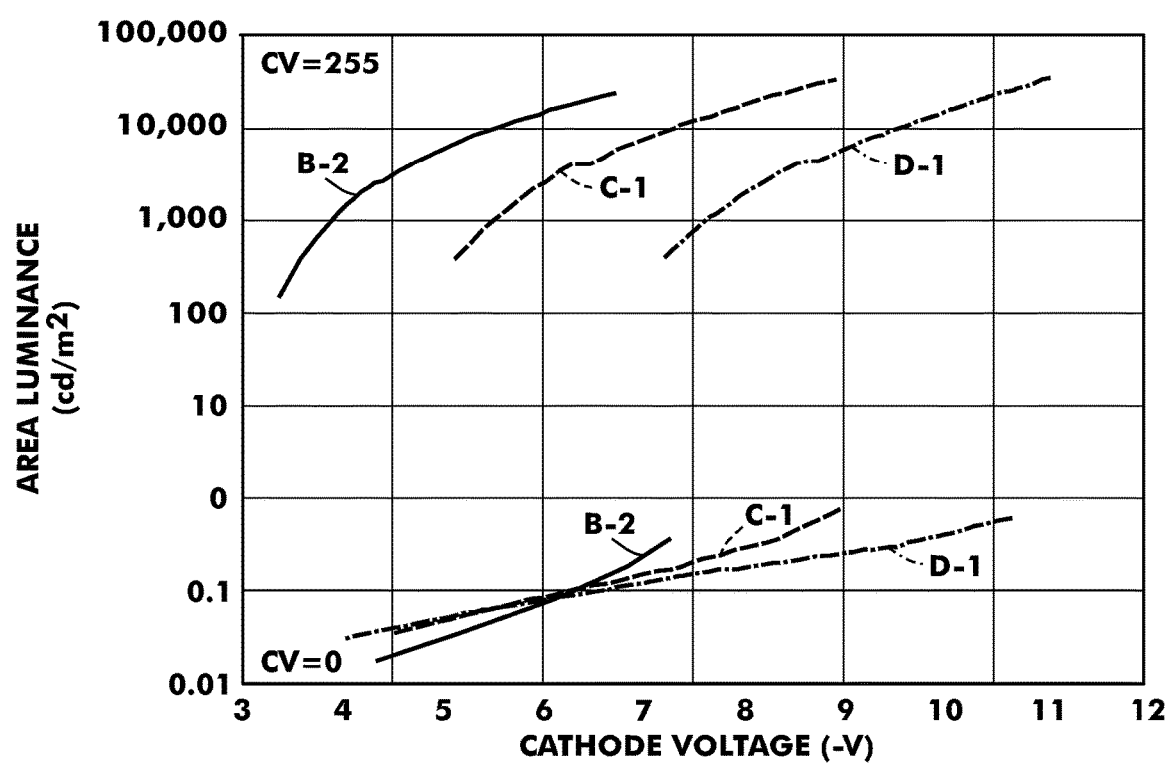
FIG. 21 shows a plot of Luminance vs Voltage for some inventive OLED devices when the devices are driven to produce black and again at peak white luminance.

FIG. 21 (similar to FIG. 17) shows sets of (luminance vs cathode voltage) curves for OLEDs B-2, C-1 and D-1. In all three of these examples, the contrasts are about the same (slightly less than 105) and relatively constant over a range of cathode voltages. It is remarkable that contrast is retained even when the operating voltage of these devices are 2 or 3 times the design limits of the drive transistor.

Without being limited to any particular theory or speculation concerning why stacked OLEDs that require relatively high $V_{th}$ maintain high contrast but do not cause burn-outs or destruction when using backplanes with low voltage transistors, it may be related to the use of serially connected transistors. Current leakage in transistors is a well-known problem and generally speaking, the higher voltages and currents involved, the greater the amount of leakage. As previously discussed, this leakage can cause light emission from the OLED if it is greater than $V_{th}$. Since the overall leakage through serially connected transistors will be (leakage of $1^{st}$ transistor)×(leakage of $2^{nd}$ transistor), it may be that this multiplicative effect is sufficient to reduce the leakage at the bottom electrode of the OLED significantly enough so that the OLED does not emit due to current leakage and so, contrast is maintained.

In operation, the control circuit comprising at least two transistors with their channels connected in series in the backplane of the experimental microdisplays is an example of a compact circuit that protects the drive transistor T1 from operating under conditions outside the specified range, even when driving an OLED with 3 or more stacks with an on-off voltage range greater than the specified operating range of the LV transistor. If the on-off voltage range of the OLED exceeds the LV operating range, then only the switch transistor is exposed to these conditions. This is less detrimental to image quality than other pixel circuit designs where the driving transistor must operate outside the specific operating range.

With operation, MOSFET devices age, which results in a slow shift in some of their characteristics like threshold voltage, sub-threshold slope, and transconductance at saturation. These are all symptoms of the Negative Bias Temperature Instability (NBTI) and Hot Carrier Injection (HCI) found in p-channel transistors. By restricting operation of a transistor to within the specified voltage range for the transistor assures that the transistor characteristics will remain within a narrowly specified range for a long period such as 5 years. Operating the transistor outside the specified voltage range increases the rate of change of the transistor characteristics, thereby reducing the period where the characteristics are within the specified range.

It is important that the characteristics of the drive transistor remain within the specified limit or the result can be image degradation (frequently called mura). The operation of the switch transistor is more robust to its changes in performance characteristics, and can be driven with a wide enough gate voltage that assures satisfactory operation even when the transistor characteristics have shifted to be outside the specified range. Thus, the circuits shown in FIGS. 2-6, including that used in the backplane for the inventive experimental stacked OLED microdisplays, are examples of a compact circuit that is designed to handle the higher on-off voltages associated with 3 or more OLED units without the expected decline in the display quality expected due to exceeding the specified operating range of the transistors.

The circuits in FIGS. 2-6 are believed to achieve this by the choice of the SELECT2 voltages for emission "on" and emission "off". For emission "off", a reasonable choice for the SELECT2 voltage is $V_{DD}$, which will put T2 in the subthreshold region of operation, effectively stopping the current. For the emission "on", the SELECT2 voltage can be chosen as low as 5V below $V_{DD}$.

In the event that the on-off voltage swing of the OLED is less than about 4V, then when the pixel is displaying "black", the black-level current will be set by the driving transistor in a normal fashion and the drain of T1 will be above the SELECT2 "on" voltage and the switch transistor T2 remains conductive. However, when the on-off voltage swing of the OLED is larger than about 4V, as in the case of multi-unit stacked OLEDs with more than 4 units, when creating the black-level current, the drain voltage of T1 (also the source voltage of T2) approaches the SELECT2 "on" voltage, and the switch transistor T2 is shut off as the low drain voltage of T1 reduces the overvoltage of T2 (Vgs–Vth) to zero or slightly negative. This drives T2 into the sub-threshold regime, creating the black level. Under these conditions created by the multi-unit stacked OLED, the drive transistor T1 is controlling T2 to create the black level current.

For these reasons, it is believed that the simple serially connected transistor design shown in FIGS. 2-6 is able to drive a multi-unit stacked OLED with an on-off voltage range in excess of the voltage range of the low-voltage transistors with less age-related mura than a single transistor driving circuit, for example shown in FIG. 1.

The protective circuit is designed to maintain the voltage at the anode of the OLED below a certain level whenever the OLED is intended to be "off" or non-emitting and might help to maintain high contrast. As the cathode voltage decreases (more negative voltage), the protection circuit is designed to provide additional current in order to protect the driving and switch transistors from voltage levels violating the maximum rating of the devices.

However, the protective effect is still observed in the experimental examples where the base of the BJT is isolated and not connected to an external power source, so that the base voltage is not intentionally controlled. It has been observed that in devices lacking the stacked OLED that the exponential slope of the black-current vs voltage for the OLED display (0.75 decade/volt) is similar to examples with the OLED present. This implies that the protection circuit is still providing some current and voltage control at the anode of the OLED even when the base of the BJT is isolated. Without being limited to any particular theory or speculation, it is possible that a neighboring n-well (for example, the n-well of the switch transistor T2) could be a source of holes that migrate to the p-well (the base) of the BJT BJT1. Once these holes are in the base, they would diffuse across the depletion region to the n-type emitter contact (OLED anode pad) travelling through the Base Emitter diode in the forward direction. This would be complemented by the diffusion of thermally excited electrons from the emitter into the base, and their transport through the base and the depletion region into the collector which is facilitated by the large electric field potential between base and collector. In this scenario, holes from the neighboring n-wells (of the drive or switch transistors) provides the charges (holes) into the base that would normally come from the external base connection. As the OLED anode voltage drops to very low levels (e.g., for showing black with 3 or more OLED units), then the potential differential between a neighboring n-well of one of the driving circuit transistors (which would be at $V_{DD}$) and the BJT base (at the OLED anode voltage) is very large, increasing the flow of holes into the BJT base from the drive-transistor well. This increase in base current, increases the emitter current due to the amplification by the BJT.

However, the protective effect provided by the protective circuit is different for each frame and must be reset appropriately for each new frame of the image. When the base of the BJT is connected to an external power source and being actively controlled for each frame, this is not an issue. For the embodiments where the base of the BJT is isolated and not intentionally connected, the reset for each frame can be provided when the pixel is turned "off" by the switch transistor as it provides the shuttering effect. Thus, this aspect of the protective effect control motion depends on having the serially connected drive and switch transistors as it is necessary to turn off emissions during data loading (or at some part of the frame time) to have the reset.

OLED formulations with three or more units can be designed so that the voltage range from the black level (below Vth; e.g., 2 uA/cm2) to the white level (20 mA/cm2) is relatively constant and less than about 6V. As shown in FIGS. 17 and 21, this can result in a contrast of about 10,000:1, and can be slightly less due to current efficiency drop at the high end of the current densities. This voltage range is approximately within the allowable operating range of the LV transistors with the protection circuit becoming active only at the bottom end of the current range when the drive transistor and/or switch transistor stop the current. Thus, at the low current end of the range, the protection circuit additionally prevents the current density through the OLED from falling below about 2 uA/cm². While this effect is in addition to the protection provided by having at least two serially connected transistors as discussed above, it also limits the ability to achieve higher contrast. In exchange for this slightly elevated black level and reduced contrast, the protection circuit allows pushing the pixel drive circuit by lowering the cathode voltage to achieve higher peak brightness or to compensate for efficiency loss due to OLED aging with assurance that the LV transistors are operating within their specified voltage range.

The above description describes a number of different embodiments which may involve different combinations of different individual features. Individual features from any of the embodiments may be combined in any order or extent without limitation as desired, except when incompatible.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

MP1 Switch transistor
MP2 Driving transistor
C1 Capacitor
$V_{DD}$ External power source
SELECT1-SELECT3 Select lines
T1 First p-channel driving transistor
T2 Switch transistor
T3 In-line selecting transistor
$V_{CATHODE}$ Cathode voltage
IBD1-IBD6 Intrinsic body diodes
$V_{DD2}$ External power source
T4 Second p-channel switch transistor
T6 Protection circuit p-channel transistor
D4 Diode
$V_{REF}$ Reference voltage
BJT1 Bipolar junction transistor
LSC Level shift circuit
1 Pixel Definition Layer
3 Silicon backplane
5 Optional planarization layer
7 Electrical contacts
9 First electrode segments
9A First electrode layer
9B Reflective layer
11, 23 Non-light-emitting OLED layers
13 First light-emitting OLED unit
13A Red light-emitting OLED unit
15, 19, 24 Charge generation Layers
16 Yellow light-emitting unit
17 Second Light-emitting OLED unit
17A Green light-emitting OLED unit
21 Third light-emitting OLED unit
21A Blue light-emitting OLED unit
22 Blue light-emitting layer
25 Top electrode
27 Encapsulation
29 Color Filter Array
29B Blue color filter
29G Green color filter
29R Red color filter
30 Microcavity
32 Second blue-light emitting unit
45, 50 Power sources
GND Ground
100 RGB Pixelated OLED
200 Multimodal OLED microcavity device
300 Multimodal OLED microcavity device
400 Multimodal OLED microcavity device

The invention claimed is:

1. A microdisplay comprising a light emitting OLED stack on top of a silicon-based backplane with individually addressable pixels and control circuitry wherein:
   the light emitting OLED stack has three or more OLED units between a top and a bottom electrode; and
   the control circuitry of the silicon-based backplane comprises, for each individually addressable pixel, at least two transistors with their channels connected in series between an external power source $V_{DD}$, and the bottom electrode of the OLED stack
   where the transistors with their channels connected in series are both rated at 5V or lower.

2. The microdisplay of claim 1 wherein the Vth of the light emitting OLED stack is at least 7.5V or greater.

3. The microdisplay of claim 1 wherein the Vth of the light emitting OLED stack is at least 10V or greater.

4. The microdisplay of claim 1 wherein the OLED stack comprises four or more OLED light-emitting units.

5. The microdisplay of claim 1 wherein the OLED light-emitting units are each separated from each other by a charge-generation layer (CGL).

6. The microdisplay of claim 5 wherein the bottom electrode is segmented and each segment is in electrical contact with the control circuitry in the backplane.

7. The microdisplay of claim 6 wherein the OLED stack is top-emitting.

8. The microdisplay of claim 7 wherein the OLED stack forms a microcavity where the physical distance between the segmented bottom electrode and the top electrode is constant across all pixels.

9. A microdisplay comprising a light emitting OLED stack on top of a silicon-based backplane with individually addressable pixels and control circuitry wherein:
the light emitting OLED stack has three or more OLED units between a top and a bottom electrode; and
the control circuitry of the silicon-based backplane comprises, for each individually addressable pixel, at least two transistors with their channels connected in series between an external power source $V_{DD}$, and the bottom electrode of the OLED stack
where the transistor closest to the power source is a driving transistor and is rated at 5V or lower and the transistor closest to the bottom electrode of the OLED is a switch transistor and is rated at greater than 5V.

10. The microdisplay of claim 1 wherein the two transistors with their channels connected in series are both p-channel transistors.

11. The microdisplay of claim 10 wherein the two transistors with their channels connected in series are each located in separate wells.

12. The microdisplay of claim 1 wherein the control circuitry additionally comprises a protection circuit comprising a p-channel transistor.

13. The microdisplay of claim 1 wherein the control circuitry additionally comprises a protection circuit comprising a p-n diode.

14. The microdisplay of claim 13 wherein the cathode of the p-n junction diode is connected to the node of the bottom electrode of the OLED stack and the anode is connected to a voltage reference $V_{REF}$ or a current reference $I_{REF}$.

15. The microdisplay of claim 1 wherein the control circuitry additionally comprises a protection circuit comprising a bipolar junction transistor.

16. The microdisplay of claim 15 wherein the bipolar junction transistor is an NPN transistor wherein the base is connected either to a voltage source VPROTECT or a current source IPROTECT, the emitter is connected to a node connected to the bottom electrode of the OLED stack and the collector is connected to voltage source $V_{DD}$.

17. The microdisplay of claim 15 wherein the base of the bipolar junction transistor is isolated, the emitter is connected to a node connected to the bottom electrode of the OLED stack and the collector is connected to voltage source $V_{DD}$.

18. The microdisplay of claim 15 wherein the bipolar junction transistor is located in a separate well from the two transistors whose channels are connected in series.

19. The microdisplay of claim 18 wherein the two transistors with their channels connected in series are both p-channel transistors and are each located in separate n-wells and the bipolar junction transistor is a NPN transistor located in a separate p-well.

* * * * *

UNITED STATES PATENT AND TRADEMARK OFFICE
CERTIFICATE OF CORRECTION

| | |
|---|---|
| PATENT NO. | : 12,249,278 B2 |
| APPLICATION NO. | : 17/601202 |
| DATED | : March 11, 2025 |
| INVENTOR(S) | : John Hamer et al. |

Page 1 of 1

It is certified that error appears in the above-identified patent and that said Letters Patent is hereby corrected as shown below:

In the Specification

Column 17 Line 45 and Column 17 Line 59, "FIG. 8A" should read --FIG. 8--.

Column 19 Line 46, "FIG. 2c" should read --FIG. 4--.

Column 29 Line 66, "FIGS. 6a and 6b" should read --FIGS. 8 and 9--.

Signed and Sealed this
Second Day of December, 2025

John A. Squires
*Director of the United States Patent and Trademark Office*